US009818684B2

(12) United States Patent
Hiner et al.

(10) Patent No.: US 9,818,684 B2
(45) Date of Patent: Nov. 14, 2017

(54) ELECTRONIC DEVICE WITH A PLURALITY OF REDISTRIBUTION STRUCTURES HAVING DIFFERENT RESPECTIVE SIZES

(71) Applicant: Amkor Technology, Inc., Tempe, AZ (US)

(72) Inventors: David Hiner, Chandler, AZ (US); Michael Kelly, Queen Creek, AZ (US); Ronald Huemoeller, Gilbert, AZ (US); Young Rae Kim, Gwangju-si (KR); JiYoung Chung, Seongnam-si (KR); MinHo Chang, Seoul (KR); DoHyun Na, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/066,724

(22) Filed: Mar. 10, 2016

(65) Prior Publication Data
US 2017/0263544 A1 Sep. 14, 2017

(51) Int. Cl.
*H01L 23/12* (2006.01)
*H01L 21/00* (2006.01)
*H01L 23/498* (2006.01)
*H01L 23/31* (2006.01)
*H01L 21/56* (2006.01)

(52) U.S. Cl.
CPC ........ *H01L 23/49838* (2013.01); *H01L 21/56* (2013.01); *H01L 23/3107* (2013.01); *H01L 23/3121* (2013.01); *H01L 23/49822* (2013.01); *H01L 23/49894* (2013.01)

(58) Field of Classification Search
CPC ............ H01L 21/561; H01L 23/49838; H01L 23/3121; H01L 23/49822; H01L 23/49894; H01L 21/3107; H01L 21/56
See application file for complete search history.

(56) References Cited

U.S. PATENT DOCUMENTS

| | | | | | |
|---|---|---|---|---|---|
| 5,375,042 | A  * | 12/1994 | Arima | ..................... | H01L 23/10 174/255 |
| 7,825,520 | B1 * | 11/2010 | Longo | ..................... | H01L 24/19 257/686 |
| 7,994,432 | B2 * | 8/2011 | Kariya | ................. | H01L 21/4857 174/260 |
| 8,008,583 | B2 * | 8/2011 | Kariya | ................ | H01L 21/4857 174/260 |
| 8,269,337 | B2 * | 9/2012 | Hu | .......................... | H01L 23/36 257/698 |
| 8,507,806 | B2 * | 8/2013 | Kariya | ................ | H01L 21/4857 174/255 |

(Continued)

*Primary Examiner* — Alonzo Chambliss
(74) *Attorney, Agent, or Firm* — McAndrews, Held & Malloy, Ltd.

(57) ABSTRACT

A semiconductor device with enhanced interposer quality, and method of manufacturing thereof. For example and without limitation, various aspects of the present disclosure provide an interposer die that comprises a first signal distribution structure comprising at least a first dielectric layer and a first conductive layer, wherein the signal distribution structure is protected at lateral edges by a protective layer. Also for example, various aspects of the present disclosure provide a method of manufacturing a semiconductor device comprising such an interposer die.

22 Claims, 21 Drawing Sheets

(56) References Cited

U.S. PATENT DOCUMENTS

| | | | |
|---|---|---|---|
| 8,541,691 B2* | 9/2013 | Kariya | H01L 21/4857 |
| | | | 174/255 |
| 8,946,564 B2* | 2/2015 | Hu | H01L 23/147 |
| | | | 174/255 |
| 9,263,373 B2* | 2/2016 | Hu | H01L 21/4825 |
| 9,357,659 B2* | 5/2016 | Hu | H01L 23/147 |
| 9,485,874 B2* | 11/2016 | Chen | H05K 3/4038 |
| 9,543,242 B1* | 1/2017 | Kelly | H01L 23/49816 |
| 2001/0033026 A1* | 10/2001 | Nakata | C09D 183/04 |
| | | | 257/759 |
| 2007/0256858 A1* | 11/2007 | Kariya | H01L 21/4857 |
| | | | 174/260 |
| 2015/0371932 A1* | 12/2015 | Hu | H01L 21/4825 |
| | | | 257/666 |
| 2017/0125347 A1* | 5/2017 | Hu | H01L 23/5386 |

\* cited by examiner

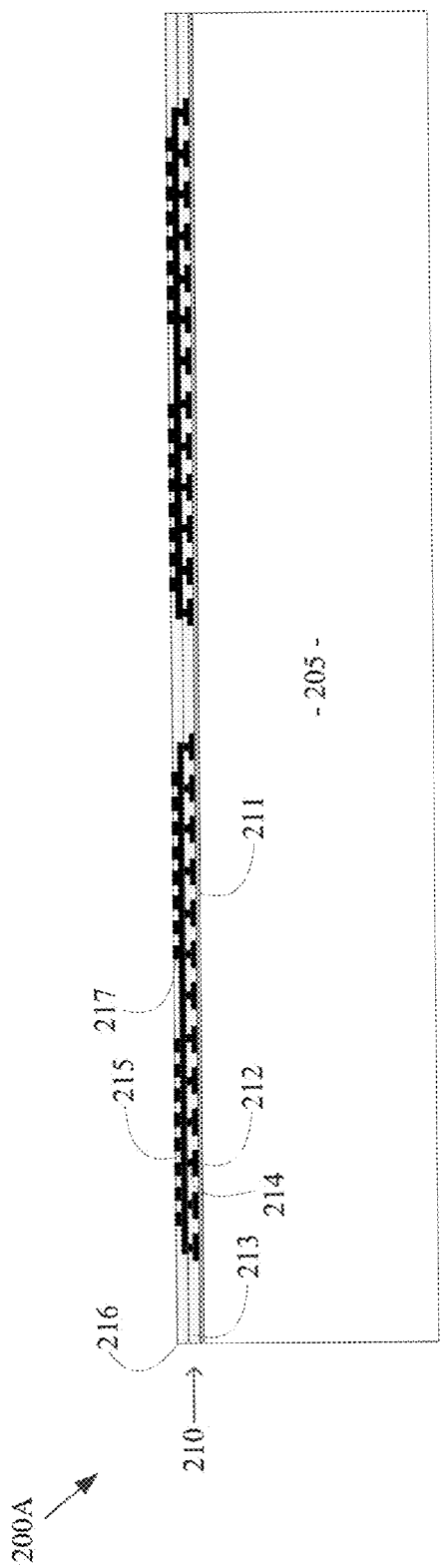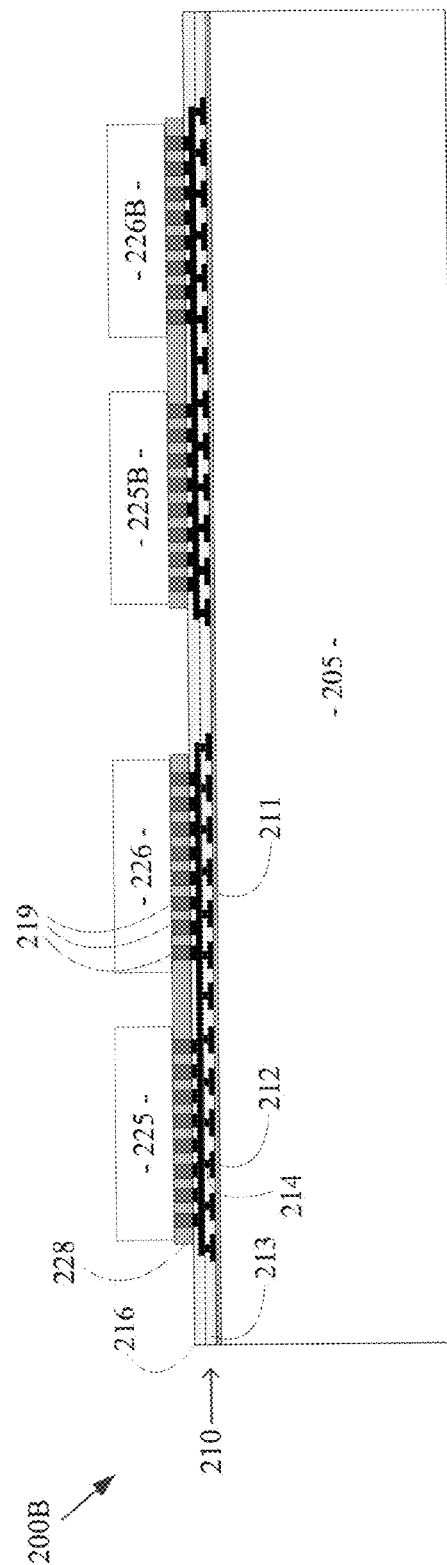

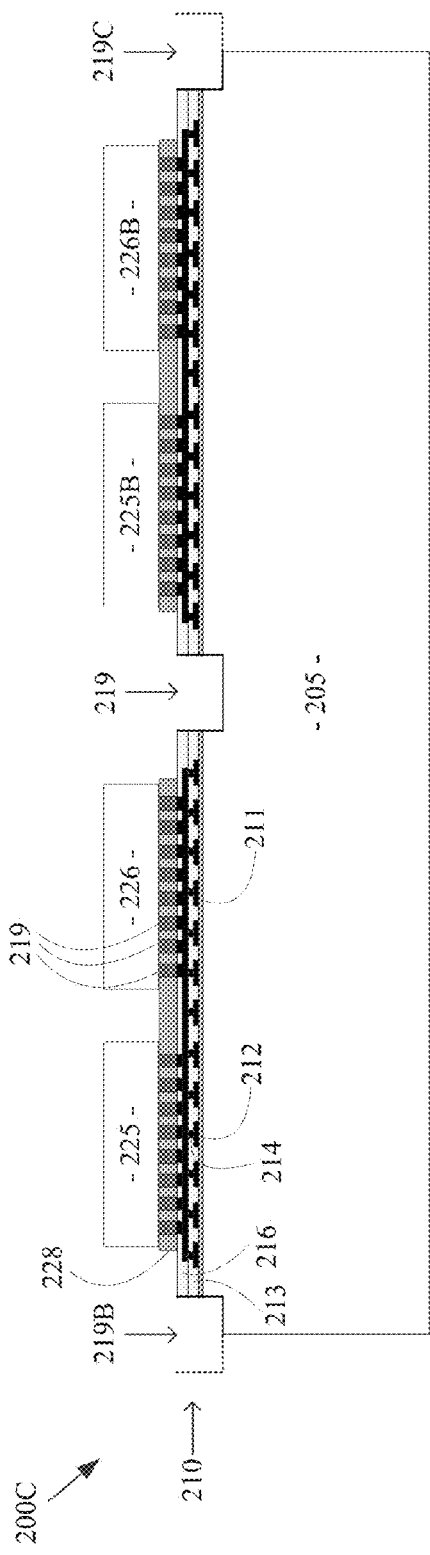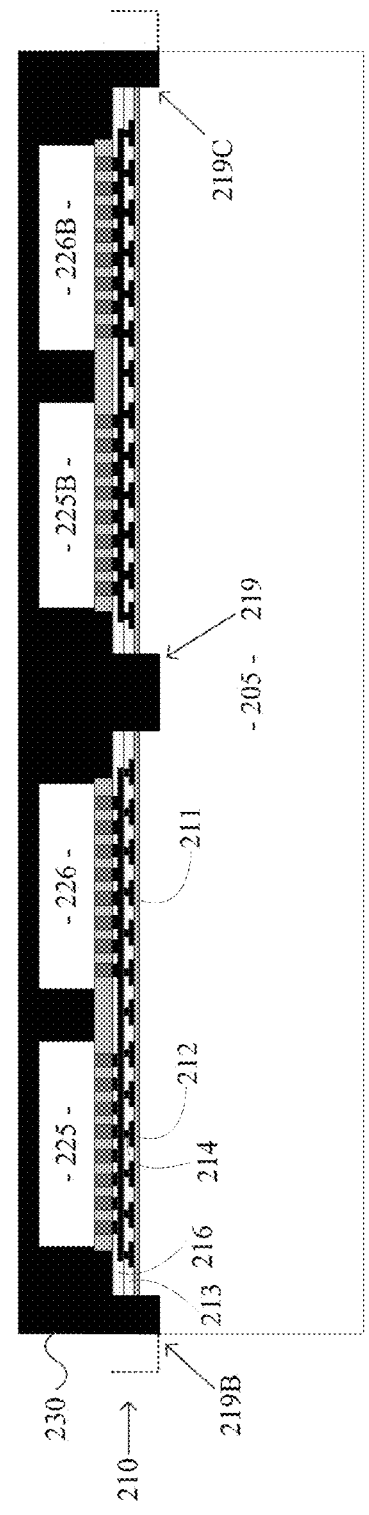
Figure 2C
Figure 2D

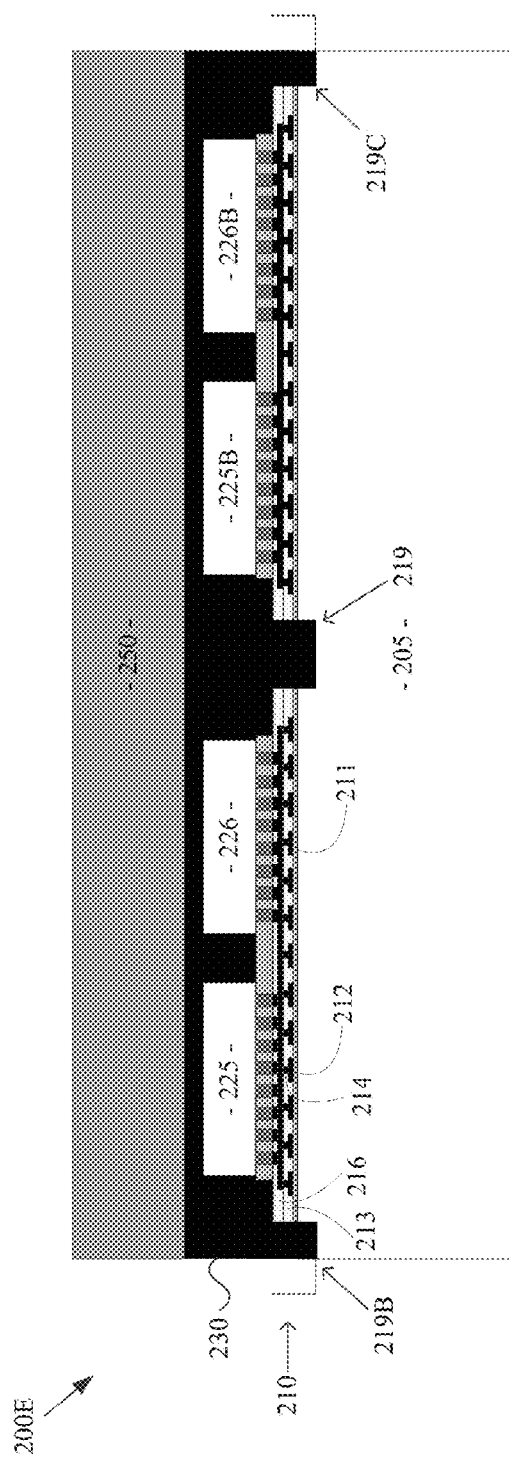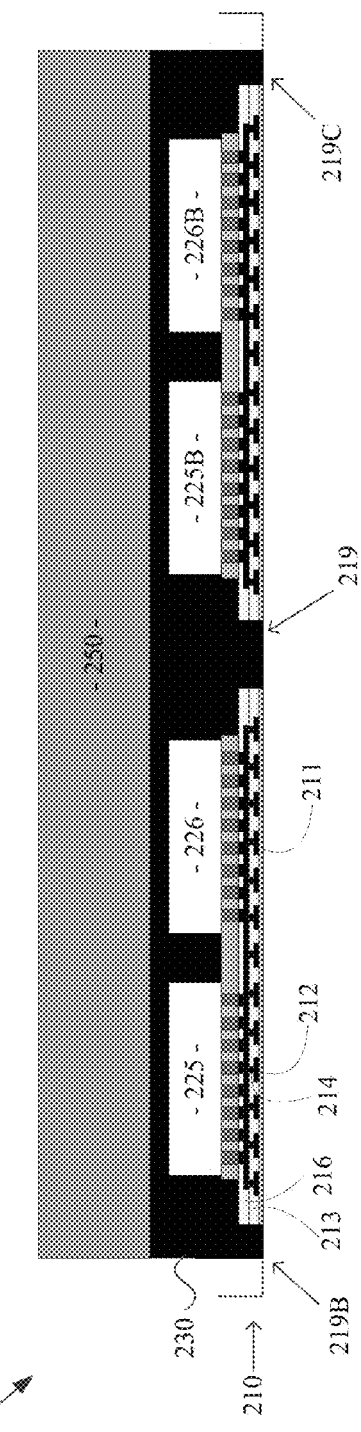
Figure 2E
Figure 2F

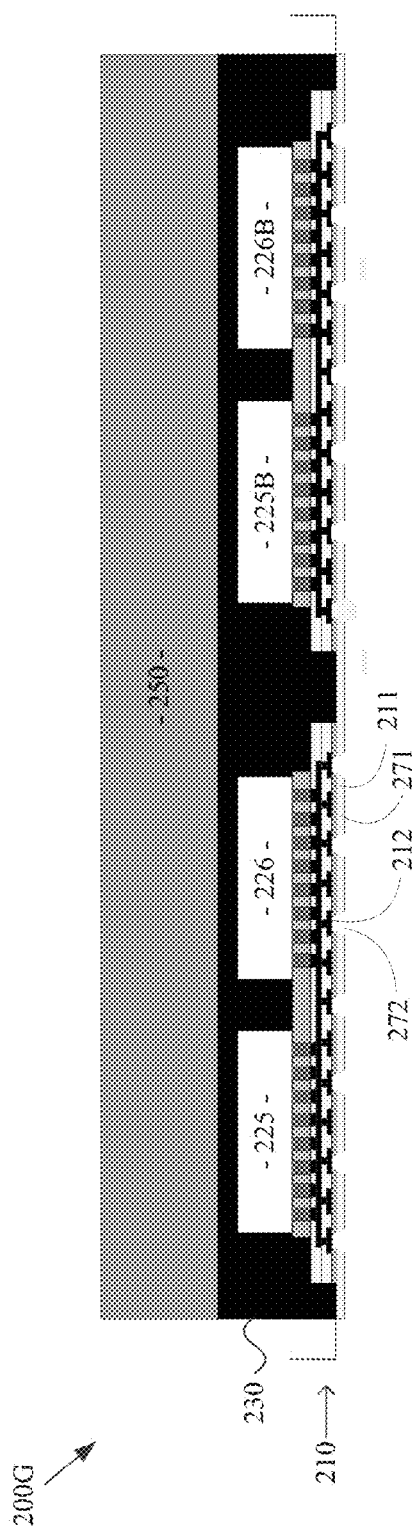
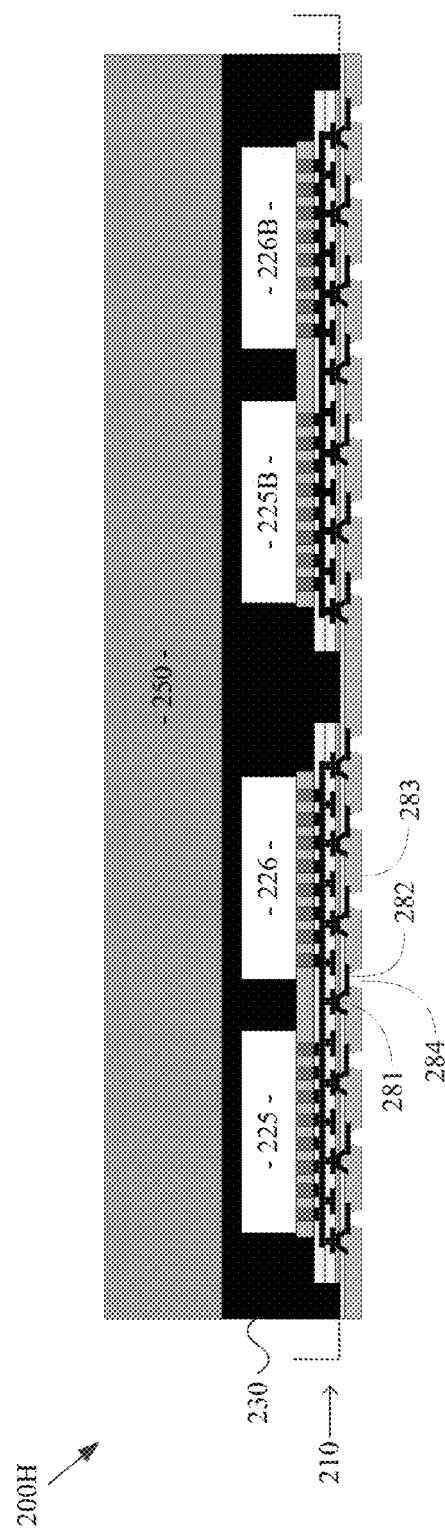
Figure 2G
Figure 2H

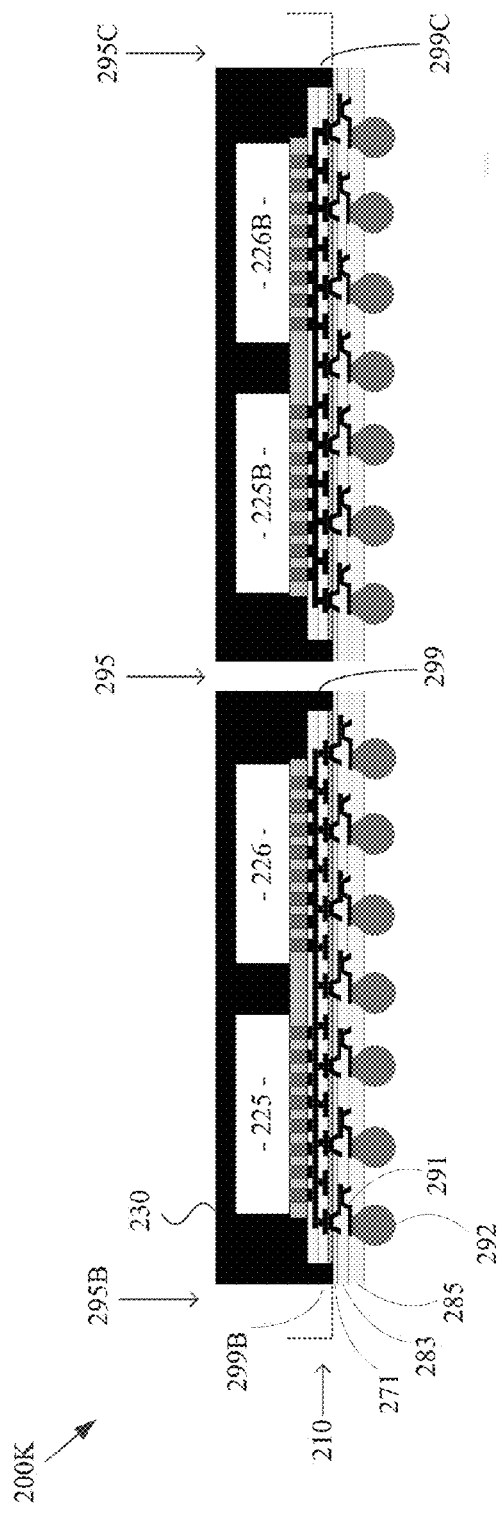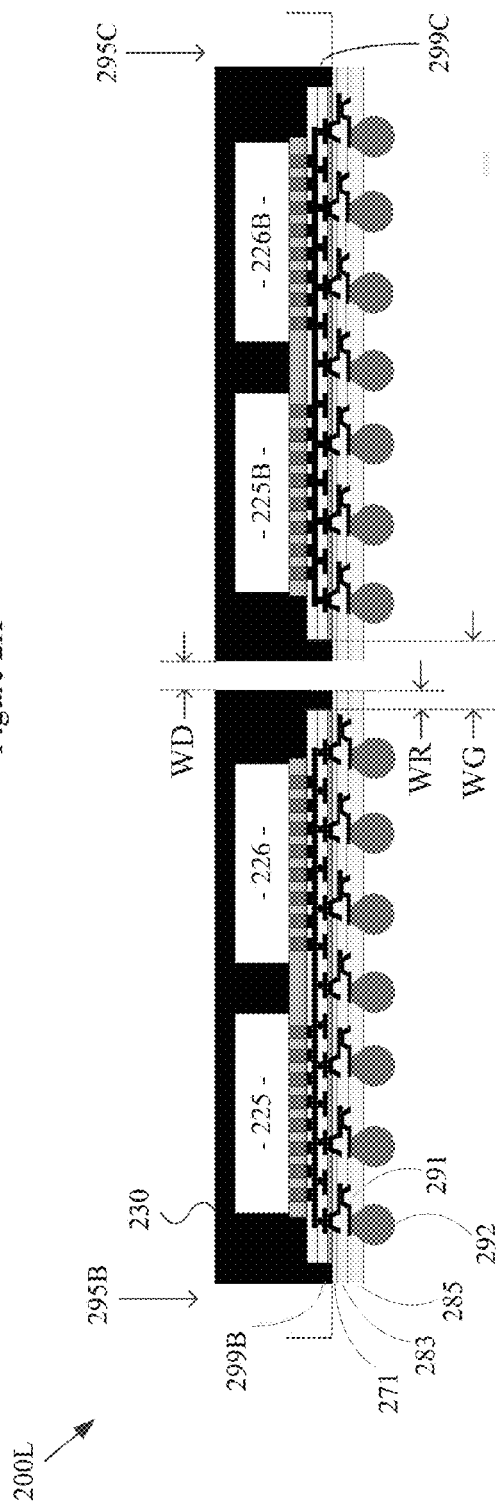

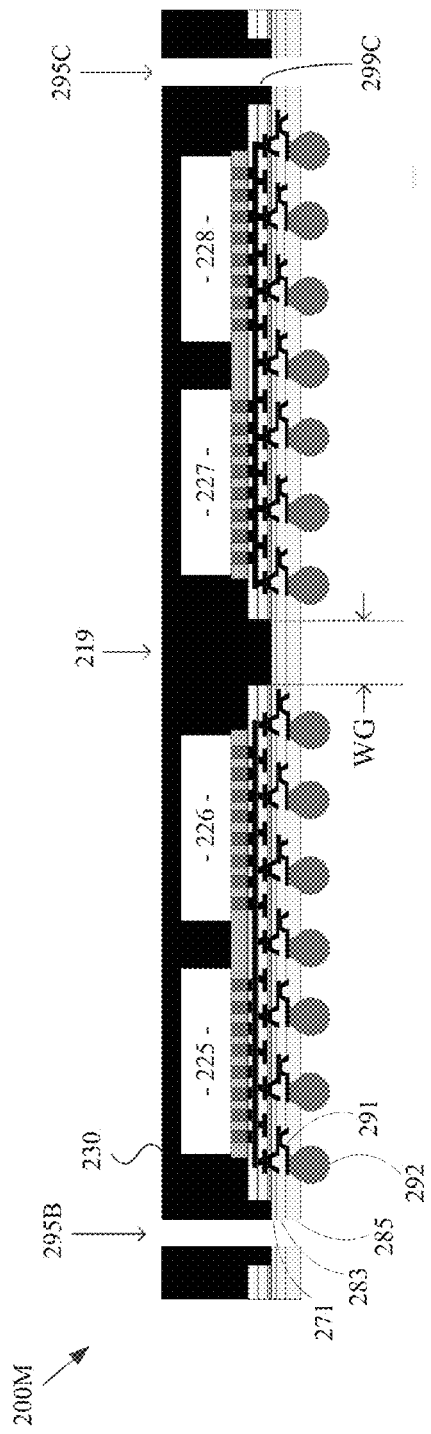
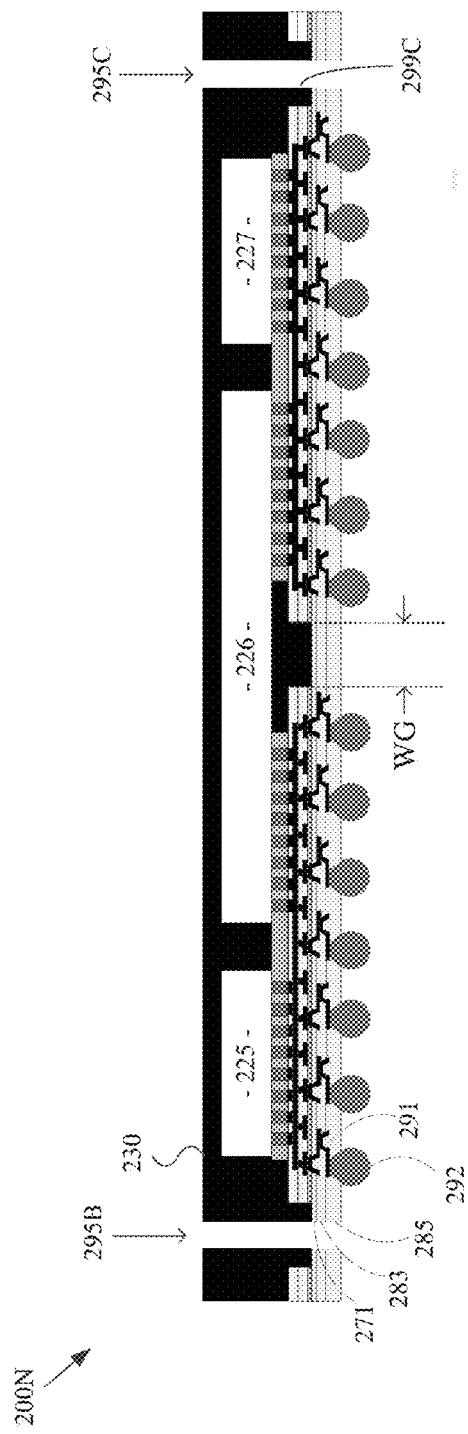

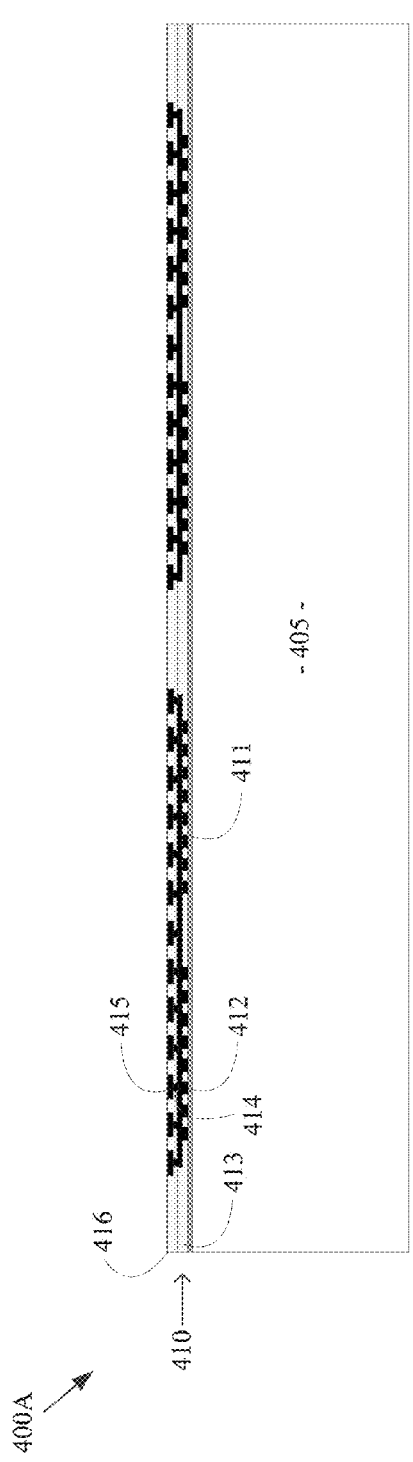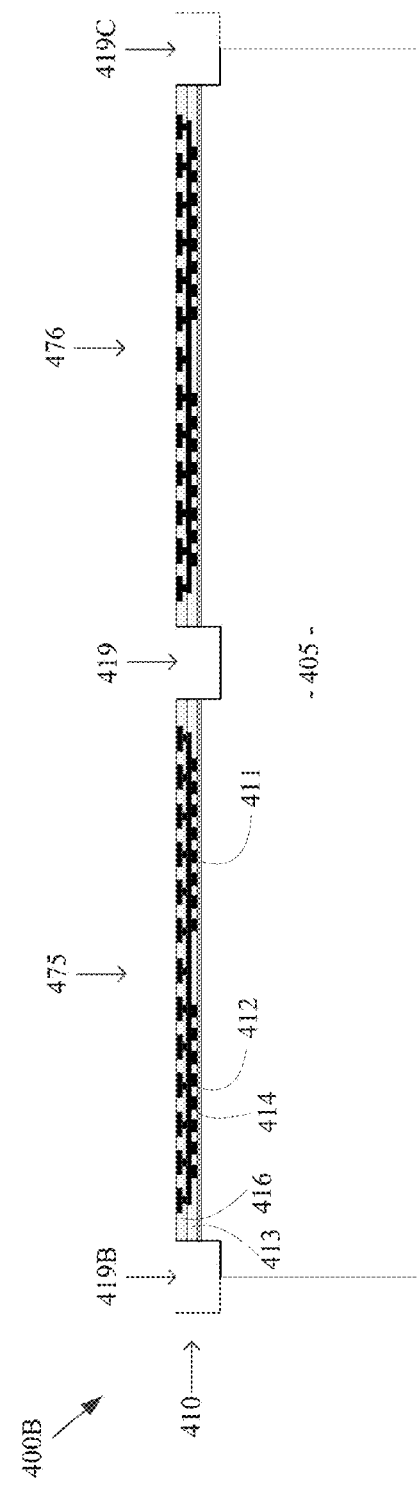
Figure 4A
Figure 4B

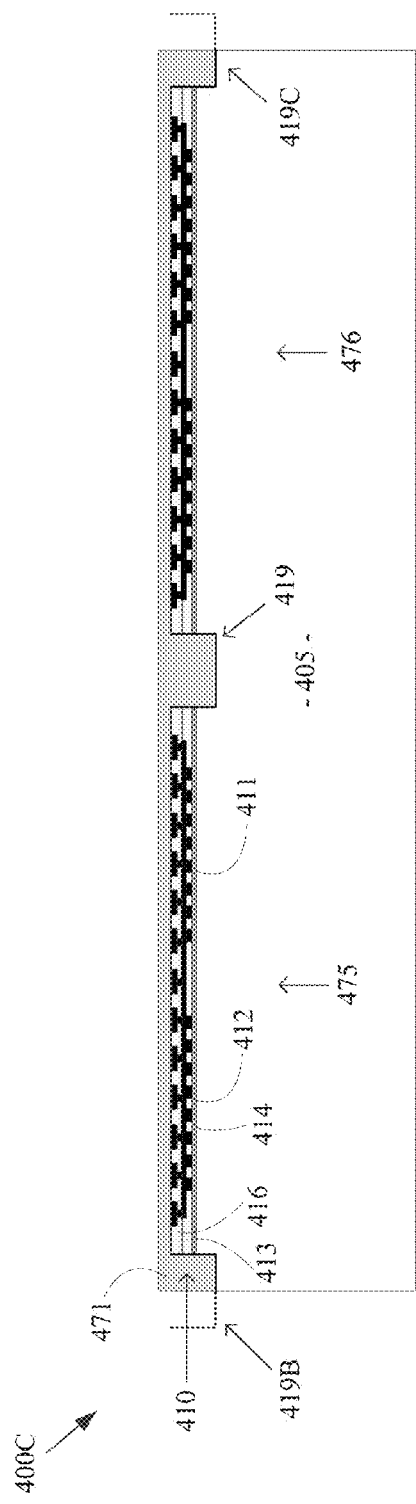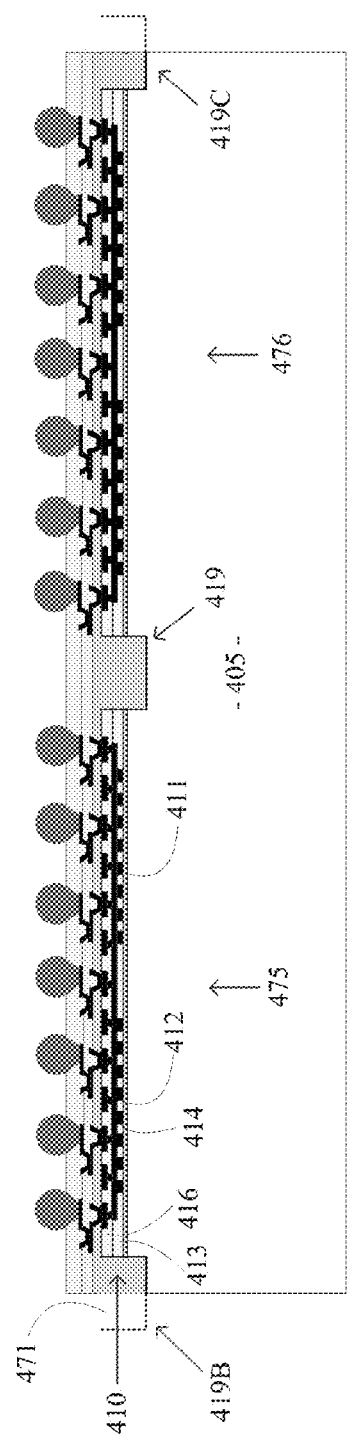

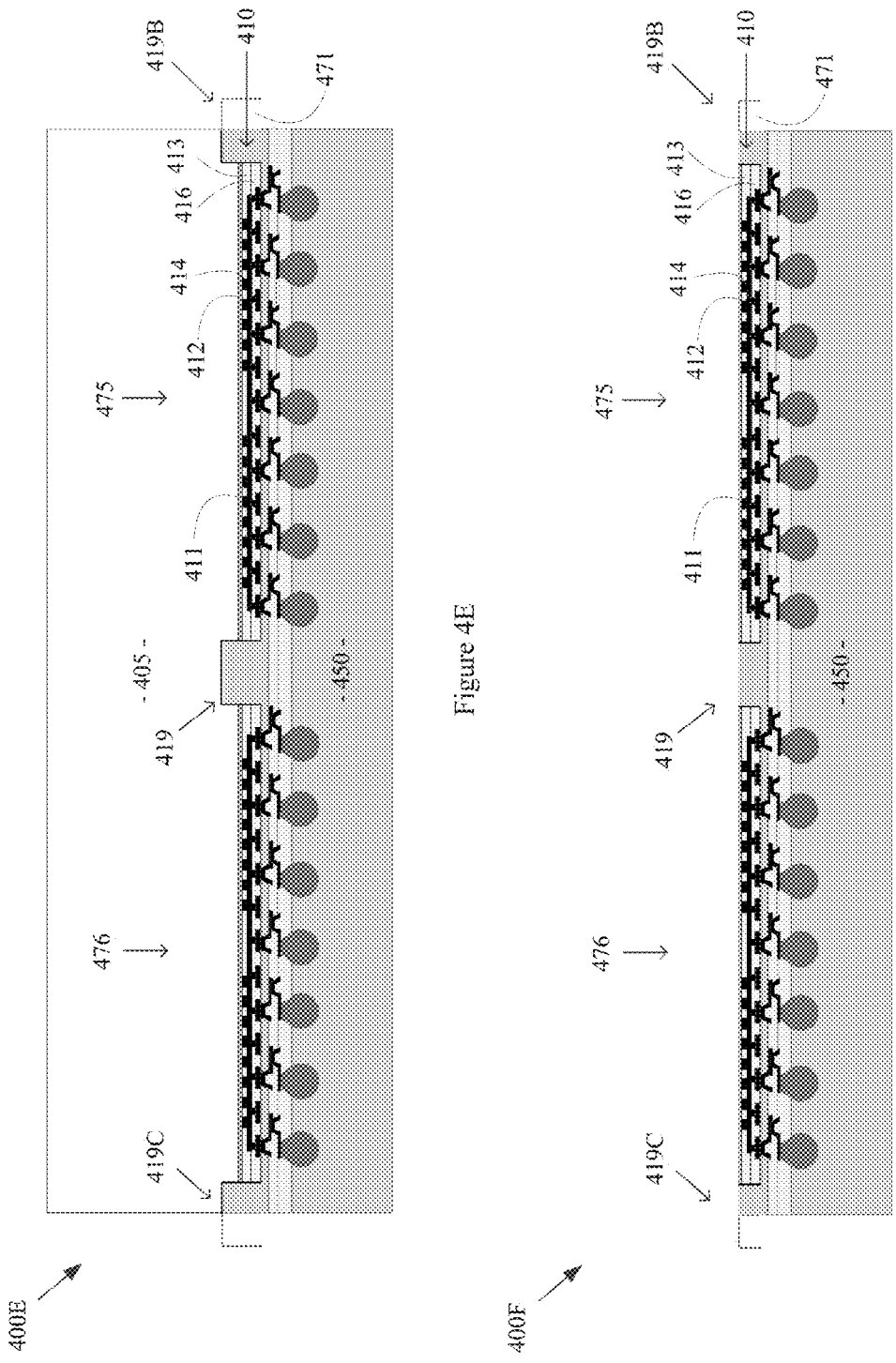

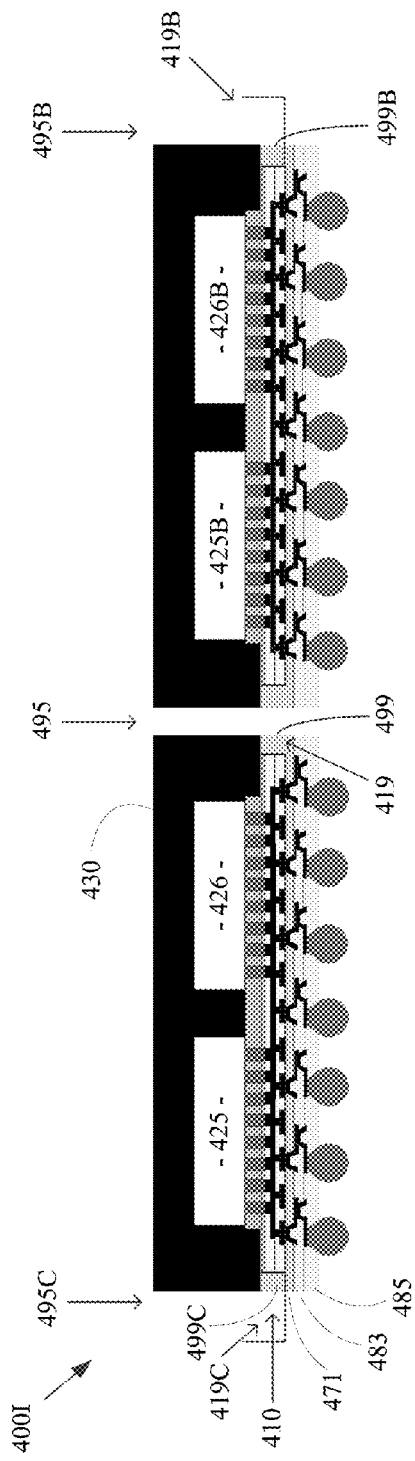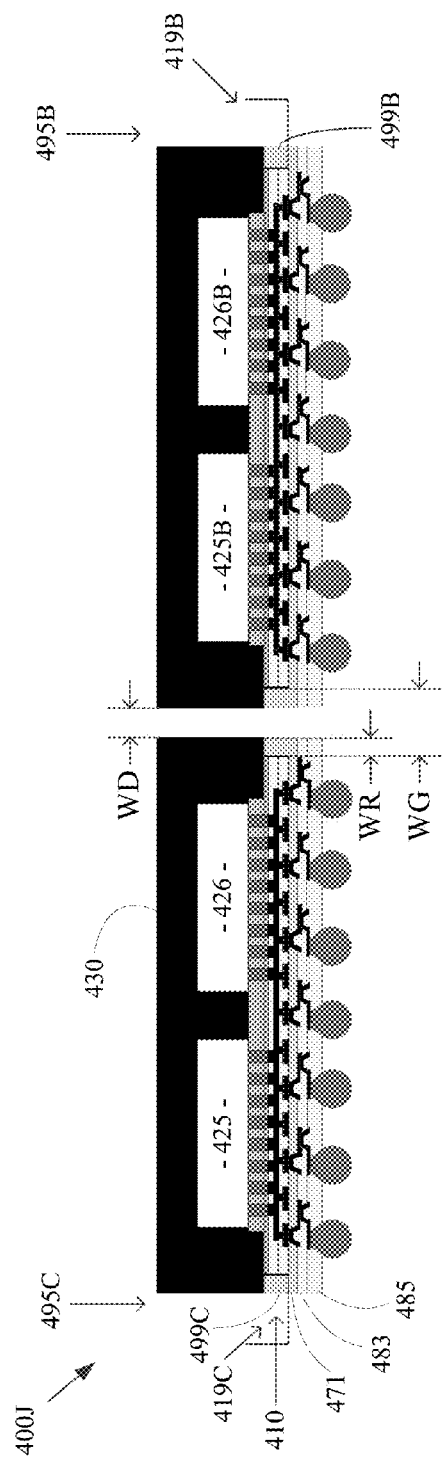

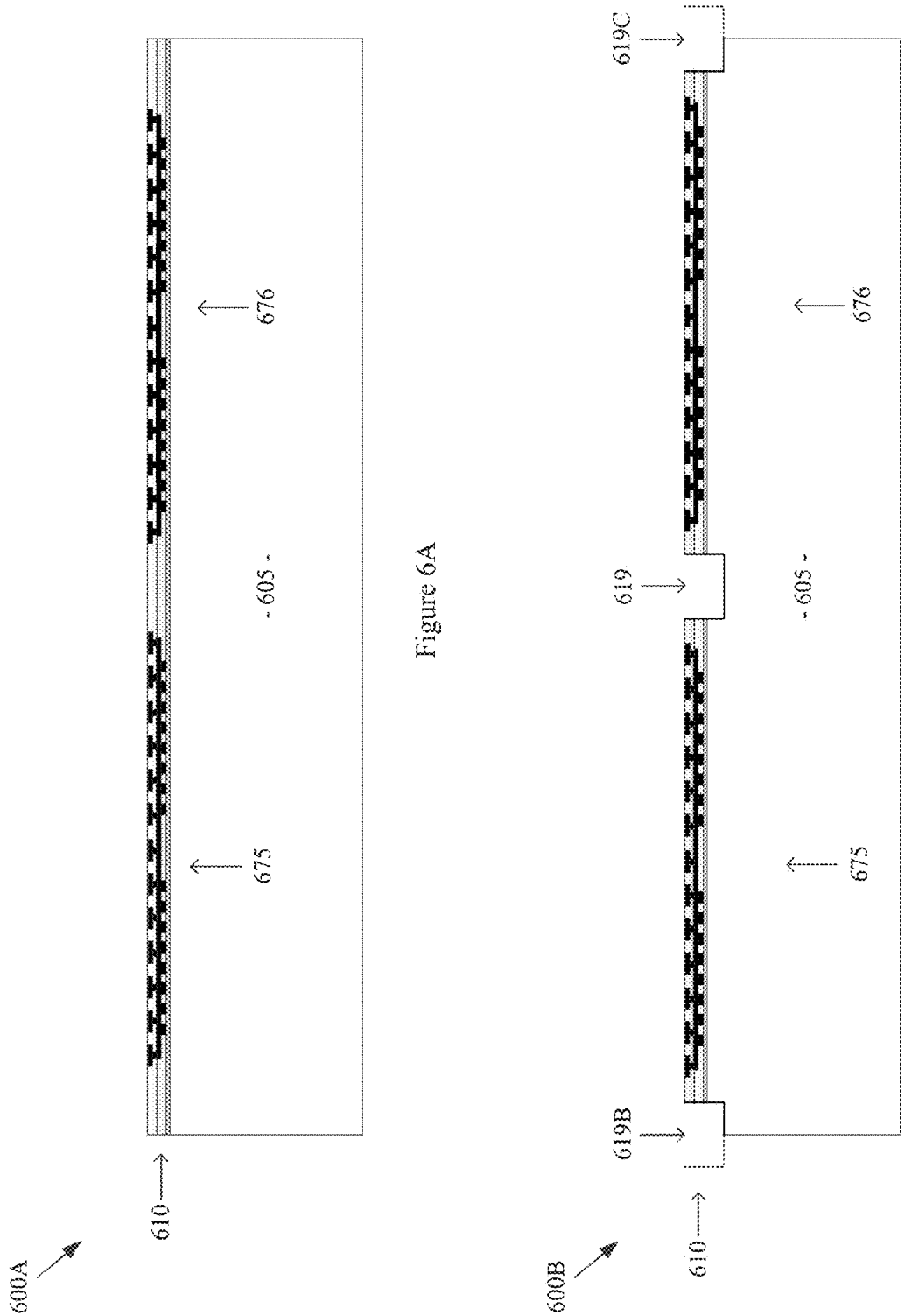

ELECTRONIC DEVICE WITH A PLURALITY OF REDISTRIBUTION STRUCTURES HAVING DIFFERENT RESPECTIVE SIZES

CROSS-REFERENCE TO RELATED APPLICATIONS/INCORPORATION BY REFERENCE

This application is related to U.S. patent application Ser. No. 14/823,689, filed Aug. 11, 2015, and titled "Semiconductor Package and Fabricating Method Thereof"; and with those disclosed in U.S. Provisional Patent Application No. 62/287,544, filed Jan. 27, 2016, and titled "Semiconductor Package and Fabricating Method Thereof"; the entire contents of each of which are hereby incorporated herein by reference.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 4A-4J show cross-sectional views illustrating an example electronic device and an example method of making an electronic device, in accordance with various aspects of the present disclosure.

FIGS. 6A-6H show cross-sectional views illustrating an example electronic device and an example method of making an electronic device, in accordance with various aspects of the present disclosure.

SUMMARY

Figure 1:
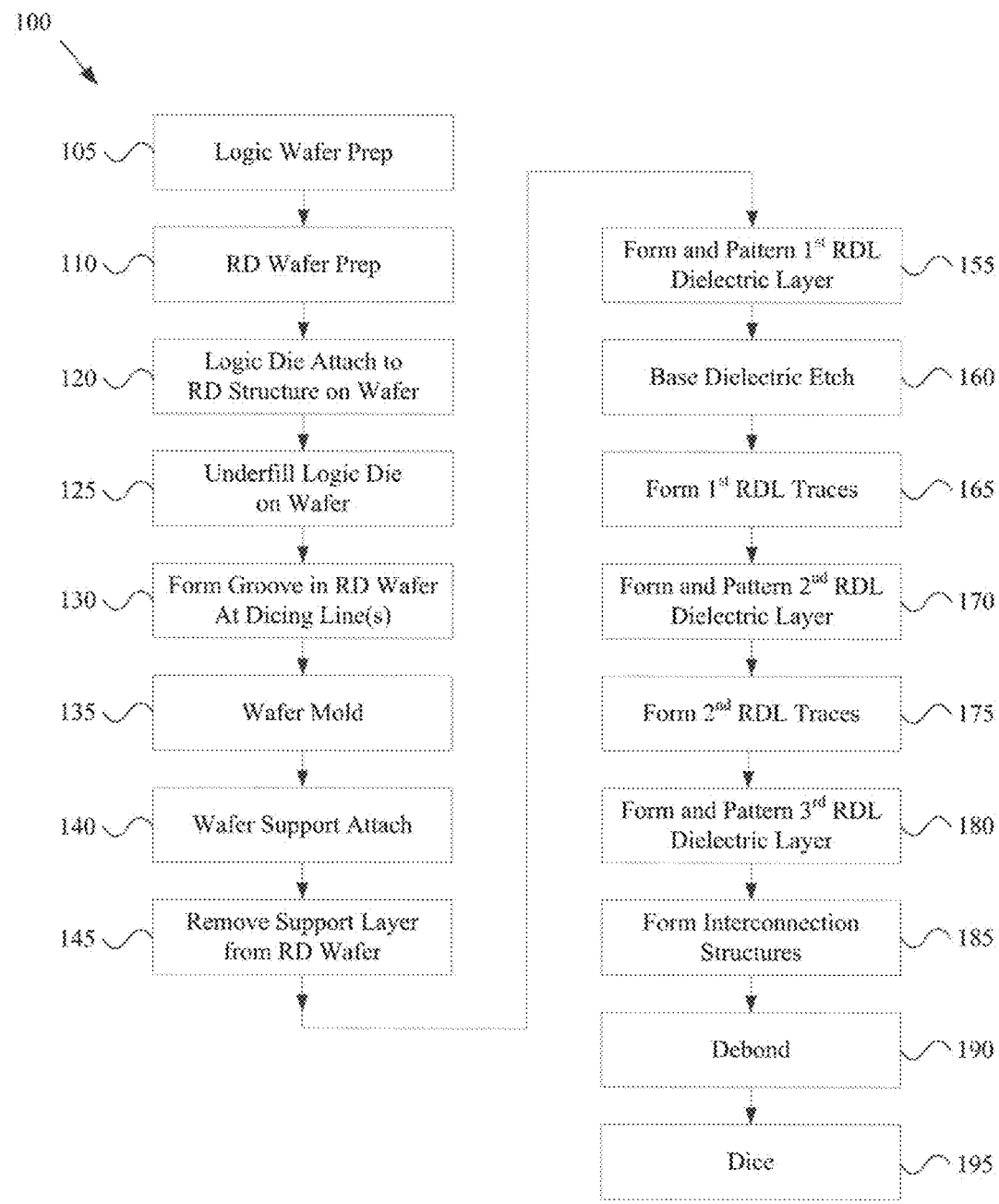
FIG. 1 shows a flow diagram of an example method of making an electronic device.

Various aspects of the present disclosure provide a semiconductor device with enhanced interposer quality, and method of manufacturing thereof. For example and without limitation, various aspects of the present disclosure provide an interposer die that comprises a first signal distribution structure comprising at least a first dielectric layer and a first conductive layer, wherein the signal distribution structure is protected at lateral edges by a protective layer. Also for example, various aspects of the present disclosure provide a method of manufacturing a semiconductor device comprising such an interposer die.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, and/or increase the manufacturability of the semiconductor device or package.

The above and other aspects of the present disclosure will be described in or be apparent from the following description of various example implementations. Various aspects of the present disclosure will now be presented with reference to accompanying drawings.

FIG. 1 shows a method 100 for manufacturing a semiconductor device, in accordance with various aspects of the present disclosure. The example method 100 may, for example, share any or all characteristics with other example methods discussed herein, for example with regard to FIGS. 2A-2O, 3, 4A-4J, 5, 6A-6H, 7, etc.

Figure 2I:
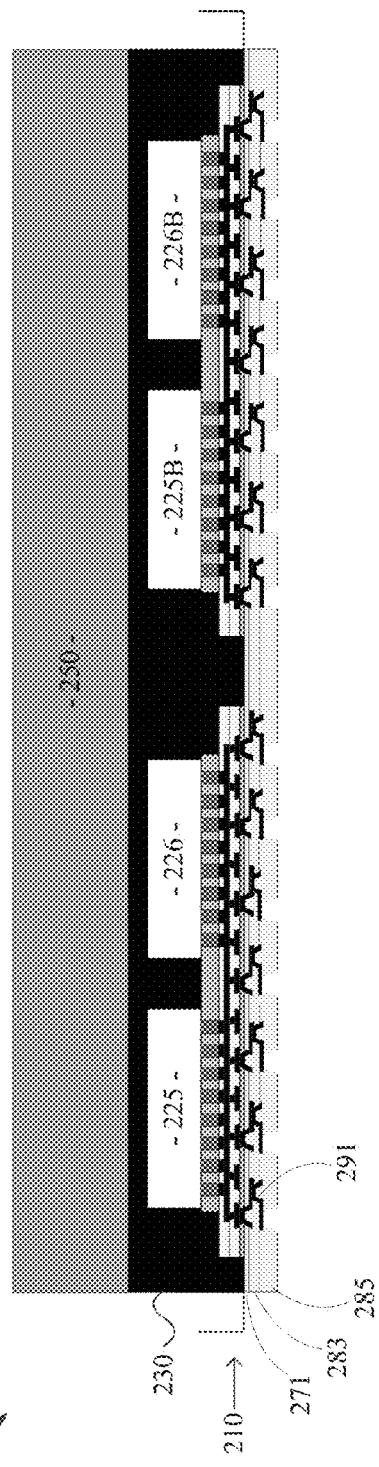
FIGS. 2A-2O show cross-sectional views illustrating an example electronic device and an example method of making an electronic device, in accordance with various aspects of the present disclosure.
Figure 2J:
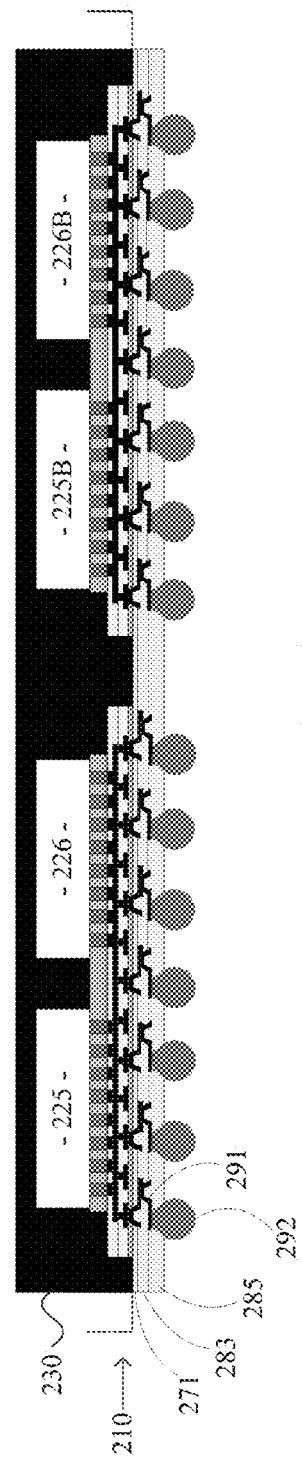
Figure 2O:
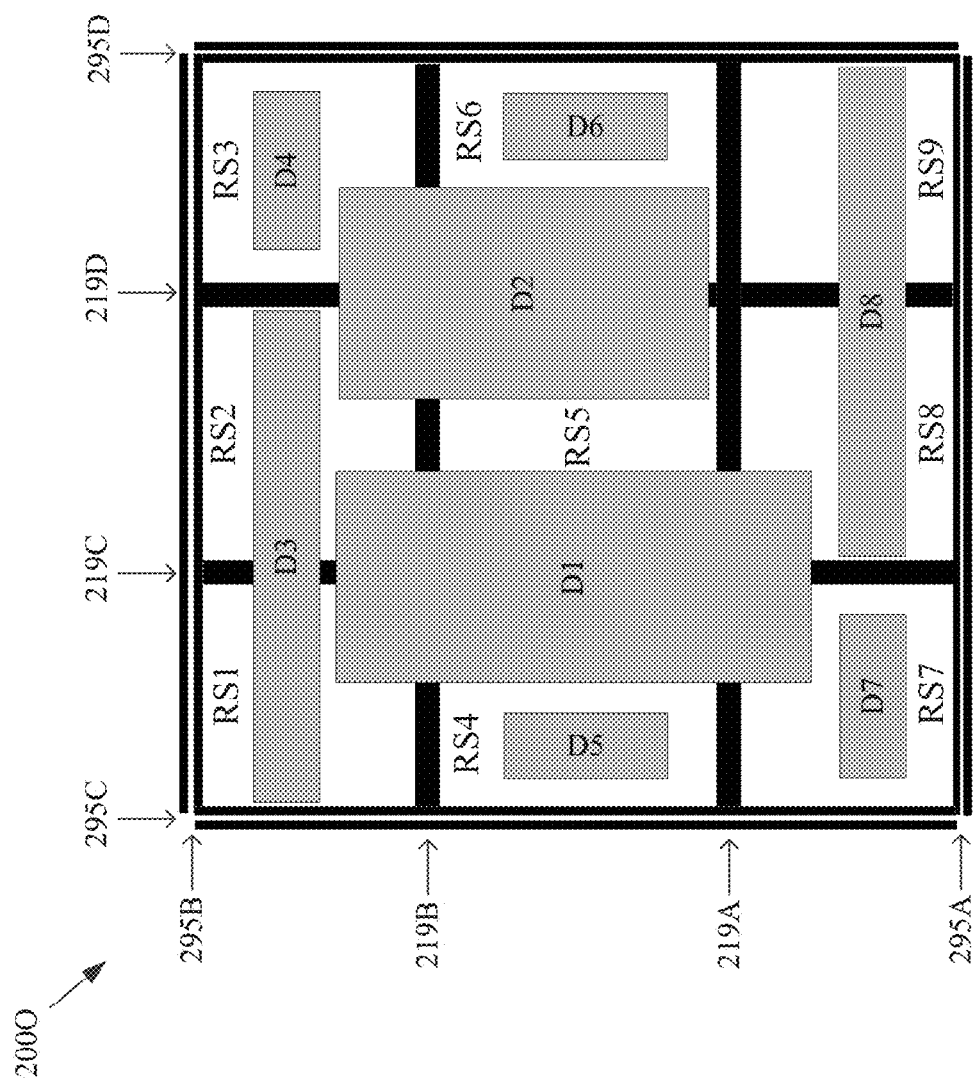

FIGS. 2A-2O are cross-sectional views illustrating various aspects of the example method 100 of FIG. 1, showing a semiconductor device being manufactured in accordance with such example method 100. The methods and structures shown in FIGS. 2A-2O may share any or all characteristics with analogous methods and structures shown in FIGS. 1, 3, 4A-4J, 5, 6A-6H, 7, etc.

FIG. 1 and FIGS. 2A-2O will now be discussed together. It should be noted that the order of the example blocks of the method 100 may vary without departing from the scope of this disclosure. It should also be noted that any of the example blocks of the method 100 may be omitted and/or other blocks inserted without departing from the scope of this disclosure.

The example method 100 may, at block 105, comprise preparing a logic wafer (or a plurality thereof, for example of same or different respective types of dies) for processing (e.g., for packaging). Block 105 may comprise preparing a logic wafer for processing in any of a variety of manners, non-limiting manner of which are provided herein. Note that various passive components may also be prepared, for example prepared for attachment. A logic die may also be referred to herein as a functional die.

For example, block 105 may comprise receiving a logic wafer, for example from supplier shipping, from an upstream process at a manufacturing site, etc. The logic wafer may, for example, comprise a semiconductor wafer that comprises a plurality of active semiconductor die. The semiconductor die may, for example, comprise a processor die, memory die, programmable logic die, application specific integrated circuit die, general logic die, etc.

Block 105 may, for example, comprise forming conductive interconnection structures on the logic wafer. Such conductive interconnection structures may, for example, comprise conductive pads, lands, bumps or balls, conductive pillars, etc. The forming may, for example, comprise attaching preformed interconnection structures to the logic wafer, plating the interconnection structures on the logic wafer, etc.

In an example implementation, the conductive structures may comprise conductive pillars comprising copper and/or nickel, and may comprise a solder cap (e.g., comprising tin and/or silver). For example, conductive structures comprising conductive pillars may comprise: (a) an under bump metallization ("UBM") structure that includes (i) a layer of titanium-tungsten (TiW) formed by sputtering (which may be referred to as a "seed layer"), and (ii) a layer of copper (Cu) on the titanium-tungsten layer formed by sputtering, (b) a copper pillar formed on the UBM by electroplating, and (c) a layer of solder formed on the copper pillar or a layer of nickel formed on the copper pillar with a layer of solder formed on the nickel layer.

Also, in an example implementation, the conductive structures may comprise a lead and/or lead-free wafer bump. For example, lead-free wafer bumps (or interconnect structures) may be formed, at least in part, by: (a) forming an under bump metallization (UBM) structure by (i) forming a layer of titanium (Ti) or titanium-tungsten (TiW) by sputtering, (ii) forming a layer of copper (Cu) on the titanium or titanium-tungsten layer by sputtering, (iii) and forming a layer of nickel (Ni) on the copper layer by electroplating; and (b) forming a lead free solder material on the nickel layer of the UBM structure by electroplating, wherein the lead free solder material has a composition by weight of 1% to 4% silver (Ag) and the remainder of the composition by weight is tin (Sn).

Block 105 may, for example, comprise performing partial or full thinning of the logic wafer (e.g., grinding, etching, etc.). Block 105 may also, for example, comprise dicing the logic wafer into separate die or die sets for later attachment. Block 105 may also comprise receiving the logic wafer from an adjacent or upstream manufacturing station at a manufacturing facility, from another geographical location, etc. The logic wafer may, for example, be received already prepared or additional preparation steps may be performed.

In general, block 105 may comprise preparing a logic wafer for processing (e.g., for packaging). Accordingly, the scope of this disclosure should not be limited by characteristics of particular types of logic wafer and/or die processing.

The example method 100 may, at block 110, comprise preparing a carrier, substrate, or wafer. The prepared (or received) wafer may be referred to as a redistribution structure wafer or RD wafer. Block 110 may comprise preparing an RD wafer for processing in any of a variety of manners, non-limiting examples of which are provided herein.

The RD wafer may, for example, comprise an interposer wafer, wafer of package substrates, etc. The RD wafer may, for example, comprise a redistribution structure (or signal distribution structure) formed (e.g., on a die-by-die basis) on a semiconductor (e.g., silicon) wafer. The RD wafer might, for example, comprise only electrical pathways and not electronic devices (e.g., semiconductor devices, passive electronic devices, etc.). The RD wafer might also, for example, comprise passive electronic devices (e.g., integrated passive devices) but not active semiconductor devices. The RD wafer might additionally, for example, comprise semiconductor devices and/or passive devices. For example, the RD wafer may comprise one or more conductive layers or traces formed on (e.g., directly or indirectly on) or coupled to a substrate or carrier. Examples of the carrier or substrate may include a semiconductor (e.g., silicon, etc.) wafer or a glass substrate. Examples of processes used to form conductive layers (e.g., copper, aluminum, tungsten, etc.) on a semiconductor wafer include utilizing semiconductor wafer fabrication processes, which may also be referred to herein as back end of line (BEOL) processes. In an example implementation, the conductive layers may be deposited on or over a substrate using a sputtering, electroplating process, electroless plating, etc. The conductive layers may be referred to herein as redistribution layers. The conductive layers may be used to route an electrical signal between two or more electrical connections and/or to route an electrical connection to a wider or narrower pitch.

In an example implementation, various portions of the redistribution structure (e.g., interconnection structures (e.g., lands, traces, etc.) that may be attached to electronic devices) may be formed having a sub-micron pitch (or center-to-center spacing) and/or less than a 2 micron pitch. In various other implementations, a 2-5 micron pitch may be utilized.

In an example implementation, a silicon wafer on which the redistribution structure is formed may comprise silicon that is a lower grade than can be adequately utilized to form the semiconductor die ultimately attached to the redistribution structure. In another example implementation, the silicon wafer may be a reclaimed silicon wafer from a failed semiconductor device wafer fabrication. In a further example implementation, the silicon wafer may comprise a silicon layer that is thinner than can be adequately utilized to form the semiconductor die ultimately attached to the redistribution structure.

Block 110 may also comprise receiving the RD wafer from an adjacent or upstream manufacturing station at a manufacturing facility, from another geographical location, etc. The RD wafer may, for example, be received already prepared or additional preparation steps may be performed.

FIG. 2A provides an example illustration of various aspects of block 110. Referring to FIG. 2A, the RD wafer 200A may, for example, comprise a support layer 205 (e.g., a silicon or other semiconductor layer, a glass layer, etc.). A redistribution (RD) structure 210 may be formed on the support layer 205. The RD structure 210 may, for example, comprise a base dielectric layer 211, a first dielectric layer 213, first conductive traces 212, a second dielectric layer 216, second conductive traces 215, and interconnection structures 217. The RD structure 210 may, for example, be a coreless signal distribution structure (e.g., without a substrate core). The RD structure 210 may also be referred to here as a signal distribution structure.

The base dielectric layer 211 may, for example, be on the support layer 205. The base dielectric layer 211 may, for example, comprise an oxide layer, a nitride layer, etc. The base dielectric layer 211 may, for example, be formed to specification and/or may be native. The base dielectric layer 211 may be referred to as a passivation layer. The base dielectric layer 211 may be or comprise, for example, a silicon dioxide layer formed using a low pressure chemical vapor deposition (LPCVD) process.

The RD wafer 200A may also, for example, comprise first conductive traces 212 and a first dielectric layer 213. The first conductive traces 212 may, for example, comprise deposited conductive metal (e.g., copper, aluminum, tungsten, etc.). The first conductive traces 212 may, for example, be formed by sputtering, plating (e.g., electroplating or electroless plating), etc. The first conductive traces 212 may, for example, be formed at a sub-micron or sub-two-micron pitch (or center-to-center spacing). The first dielectric layer 213 may, for example, comprise an inorganic dielectric material (e.g., silicon oxide, silicon nitride, etc.). Note that in various implementations, the first dielectric layer 213 may be formed prior to the first conductive traces 212, for example formed with apertures which are then filled with the first conductive traces 212 or a portion thereof. In an example implementation, for example comprising copper conductive traces, a dual damascene process may be utilized to form the traces.

In an alternative implementation, the first dielectric layer 213 may comprise an organic dielectric material. For example, the first dielectric layer 213 may comprise bismaleimidetriazine (BT), phenolic resin, polyimide (PI), benzocyclobutene (BCB), polybenzoxazole (PBO), epoxy and equivalents thereof and compounds thereof, but aspects of the present disclosure are not limited thereto. The organic dielectric material may be formed in any of a variety of manners, for example spin coating, spray coating, printing, sintering, thermal oxidation, physical vapor deposition (PVD), chemical vapor deposition (CVD), plasma vapor deposition, sheet lamination chemical vapor deposition (CVD), etc. In such an alternative implementation, the first conductive traces 212 may, for example, be at a 2-5 micron pitch (or center-to-center spacing).

The RD wafer 200A may also, for example, comprise second conductive traces 215 and a second dielectric layer 216. The second conductive traces 215 may, for example, comprise deposited conductive metal (e.g., copper, etc.). The second conductive traces 215 may, for example, be connected to respective first conductive traces 212 through respective conductive vias 214 (e.g., in the first dielectric layer 213). The second dielectric layer 216 may, for example, comprise an inorganic dielectric material (e.g., silicon oxide, silicon nitride, etc.). In an alternative implementation, the second dielectric layer 216 may comprise an organic dielectric material. For example, the second dielectric layer 216 may comprise bismaleimidetriazine (BT), phenolic resin, polyimide (PI), benzocyclobutene (BCB), polybenzoxazole (PBO), epoxy and equivalents thereof and compounds thereof, but aspects of the present disclosure are not limited thereto. The second dielectric layer 216 may, for example, be formed in any of a variety of manners, for example spin coating, spray coating, printing, sintering, thermal oxidation, physical vapor deposition (PVD), chemical vapor deposition (CVD), plasma vapor deposition, sheet lamination chemical vapor deposition (CVD), etc., but the scope of this disclosure is not limited thereto.

Though two sets of dielectric layers and conductive traces are illustrated in FIG. 2A, it should be understood that the RD structure 210 of the RD wafer 200A may comprise any number of such layers and traces. For example, the RD structure 210 might comprise only one dielectric layer and/or set of conductive traces, three sets of dielectric layers and/or conductive traces, etc.

As with the logic wafer preparation at block 105, block 110 may comprise forming interconnection structures (e.g., conductive bumps, conductive balls, conductive pillars, conductive lands or pads, etc.) on a surface of the RD structure 210. Examples of such interconnection structures 217 are shown in FIG. 2A, in which the RD structure 210 comprises interconnection structures 217, which are shown formed on the front (or top) side of the RD structure 210 and electrically connected to respective second conductive traces 215 through conductive vias in the second dielectric layer 216. Such interconnection structures 217 may, for example, be utilized to couple the RD structure 210 to various electronic components (e.g., active semiconductor components or die, passive components, etc.). Note that such interconnection structures may also be formed on the back (or bottom) side of the RD structure 210.

The interconnection structures 217 may, for example, comprise any of a variety of conductive materials (e.g., any one of or a combination of copper, nickel, gold, etc.). The interconnection structures 217 may also, for example, comprise solder.

In general, block 110 may comprise preparing a redistribution structure wafer (RD wafer). Accordingly, the scope of this disclosure should not be limited by characteristics of any particular manner of performing such preparing.

The example method 100 may, at block 120, comprise attaching one or more semiconductor die to the RD structure (e.g., of the RD wafer). Block 120 may comprise attaching the semiconductor die to the RD structure in any of a variety of manners, non-limiting examples of which are provided herein.

The semiconductor die may comprise characteristics of any of a variety of types of semiconductor die. For example, the semiconductor die may comprise a processor die, a memory die, an application specific integrated circuit die, general logic die, active semiconductor components, etc.). Note that passive components may also be attached at block 120.

Block 120 may comprise attaching the semiconductor die (e.g., as prepared at block 105) in any of a variety of manners. For example, block 120 may comprise attaching the semiconductor die utilizing mass reflow, thermocompression bonding (TCB), conductive epoxy, etc.

FIG. 2B provides an example illustration of various aspects of block 120, for example die attachment aspects. For example, the first die 225 (e.g., which may have been diced from a logic wafer prepared at block 105) is electrically and mechanically attached to the redistribution structure 210 (e.g., to interconnection structures 217 thereof). Similarly, the second die 226 (e.g., which may have been diced from a logic wafer prepared at block 105 or other logic wafer) is electrically and mechanically attached to the redistribution structure 210 (e.g., to interconnection structures 217 thereof). For example, as explained at block 105, the logic wafer (or die thereof) may have been prepared with various interconnection structures (e.g., conductive pads, lands, bumps, balls, wafer bumps, conductive pillars, copper pillars, solder-capped copper pillars, etc.) formed thereon. Such structures are shown generally in FIG. 2B as items 219. Block 120 may, for example, comprise electrically and mechanically attaching such interconnection structures to the redistribution structure 210 (e.g., to interconnection structures 217 thereof) utilizing any of a variety of attachment processes (e.g., mass reflow, thermocompression bonding (TCB), conductive epoxy, etc.).

The first die 225 and the second die 226 may comprise any of a variety of die characteristics. In an example scenario, the first die 225 may comprise a processor die and the second die 226 may comprise a memory die. In another example scenario, the first die 225 may comprise a processor die, and the second die 226 may comprise a co-processor die. In another example scenario, the first die 225 may comprise a sensor die, and the second die 226 may comprise a sensor processing die. Though the assembly 200B at FIG. 2B is shown with two die 225, 226, there may be any number of die. For example, there might be only one die, three die, four die, or more than four die.

Additionally, though the first die 225 and the second die 226 are shown attached to the redistribution structure 210 laterally relative to each other, they may also be arranged in a vertical assembly. Various non-limiting examples of such structures are shown and discussed herein (e.g., die-on-die stacking, die attachment to opposite substrate sides, etc.). Also, though the first die 225 and the second die 226 are shown with generally similar dimensions, such die 225, 226 may comprise different respective characteristics (e.g., die height, footprint, connection pitch, etc.).

The first die 225 and the second die 226 are illustrated with generally consistent pitch, but this need not be the case. For example, most or all of the contacts 219 of the first die 225 in a region of the first die footprint immediately adjacent to the second die 226 and/or most of the contacts 219 of the second die 226 in a region of the second die footprint immediately adjacent to the first die 225 may have substantially finer pitch than most or all of the other contacts 219. For example, a first 5, 10, or n rows of contacts 219 of the first die 225 closest to the second die 226 (and/or of the second die 226 closest to the first die 225) may have a 30 micron pitch, while other contacts 219 may generally have an 80 micron and/or 200 micron pitch. The RD structure 210 may thus have corresponding contact structures and/or traces at the corresponding pitch.

As shown in FIG. 2B, for example as semiconductor dies 225B and 226B, there may be a plurality of sets of the dies 226 and 226 attached to the redistribution structure 210.

In general, block 120 comprises attaching one or more semiconductor die to the redistribution structure (e.g., of a redistribution wafer). Accordingly, the scope of this disclosure should not be limited by characteristics of any particular die, or by characteristics of any particular multi-die layout, or by characteristics of any particular manner of attaching such die, etc.

The example method 100 may, at block 125, comprise underfilling the semiconductor die and/or other components attached to the RD structure at block 120. Block 125 may comprise performing such underfilling in any of a variety of manners, non-limiting examples of which are provided herein.

For example, after die attachment at block 120, block 125 may comprise underfilling the semiconductor die utilizing a capillary underfill. For example, the underfill may comprise a reinforced polymer material viscous enough to flow between the attached die and the RD wafer in a capillary action.

Also for example, block 125 may comprise underfilling the semiconductor die utilizing a non-conductive paste (NCP) and/or a non-conductive film (NCF) or tape while the die are being attached at block 120 (e.g., utilizing a thermocompression bonding process). For example, such underfill materials may be deposited (e.g., printed, sprayed, etc.) prior to attaching the semiconductor die (e.g., as pre-applied underfill or PUF).

As with all of the blocks illustrated in the example method 100, block 125 may be performed at any location in the method 100 flow so long as the space between the die and the redistribution structure is accessible.

The underfilling may also occur at a different block of the example method 100. For example, the underfilling may be performed as part of the wafer molding block 135 (e.g., utilizing a molded underfill). Note that the underfilling need not be performed at all.

FIG. 2B provides an example illustration of various aspects of block 125, for example the underfilling aspects. The underfill 228 is positioned between the first semiconductor die 225 and the redistribution structure 210 and between the second semiconductor die 226 and the redistribution structure 210, for example surrounding the contacts 219.

Though the underfill 228 is generally illustrated to be flat, the underfill 228 may rise up and form fillets on the sides of the semiconductor die and/or other components. In an example scenario, at least a fourth or at least a half of the die side surfaces may be covered by the underfill material. In another example scenario, one or more or all of the entire side surfaces may be covered by the underfill material. Also for example, a substantial portion of the space directly between the semiconductor die, between the semiconductor die and other components, and/or between other components may be filled with the underfill material. For example, at least half of the space or all of the space between laterally adjacent semiconductor die, between the die and other components, and/or between other components may be filled with the underfill material. In an example implementation, the underfill 228 may cover the entire redistribution structure 210 of the RD wafer. In such example implementation, when the RD wafer is later diced (or partially diced), such dicing may also cut through the underfill 228. In another example implementation, the space between laterally adjacent semiconductor die and/or other components may be generally free of the underfill.

In general, block 125 may comprise underfilling the semiconductor die and/or other components attached to the RD structure at block 120. Accordingly, the scope of this disclosure should not be limited by characteristics of any particular type of underfill or of any particular manner of performing such underfilling.

The example method 100 may, at block 130 comprise forming a groove in the RD wafer along dicing lines (or singulation lines) of the RD wafer. Such groove forming may also be referred to herein as partial dicing. Block 130 may comprise forming such groove(s) in any of a variety of manners, non-limiting examples are provided herein.

The groove may comprise any of a variety of characteristics. For example, the groove may have a depth greater than the thickness of the redistribution structure of the RD wafer (e.g., as formed at block 110). In an example implementation in which the redistribution structure of the RD wafer comprises one or more dielectric layers and one or more conductive layers, the groove may have a depth greater than the entire thickness of such dielectric layer(s) and conductive layer(s). For example, in an example implementation, the groove may have a depth that is greater than the thickness of the redistribution structure by at least one micron. In another example implementation, the groove may have a depth that is greater than the thickness of the redistribution structure by from one to five microns. In still another example implementation, the groove may have a total depth of up to ten microns or a depth that is greater than the thickness of redistribution structure by up to ten microns. The groove may, for example, have a depth that is less than 5% (or 10%) of the total thickness of the RD wafer.

The groove may comprise a width greater than (or, for example, no less than) a width of a dicing cut performed later, for example at block 195. For example, the groove may comprise a width that is greater than such dicing cut width by from one to two microns. Also for example, the groove may comprise a width that is greater than such dicing cut width by from three to five microns. Additionally for example, the groove may comprise a total width that is greater than such dicing cut width by no more than ten microns.

The groove may, for example, comprise a flat bottom as shown, but may also have a bowl-shaped or beveled bottom surface. Note that although the groove is generally presented with vertical sides herein, such sides may also be sloped. For example, a groove may be wider at the top than at the bottom, or vice versa.

Block 130 may comprise forming the groove in any of a variety of manners. For example, block 130 may comprise forming the groove at a controlled depth utilizing any one or more of a mechanical saw, laser saw, plasma saw, directed energy saw, etc. In an example implementation, block 130 comprises utilizing both mechanical and laser ablation to form the groove.

Note that block 130 may, for example, be performed before the logic die attachment at block 120. In general, the order of the blocks discussed herein may be changed.

FIG. 2C provides an example illustration of various aspects of block 130, for example groove-forming aspects. FIG. 2C shows an example grooved wafer 200C. The groove 219 is formed on a dicing line between the second semiconductor die 226 of a first die set (e.g., corresponding to a first semiconductor package to be formed) and a first semiconductor die 225B of a second die set (e.g., corresponding to a second semiconductor package to be formed). Additionally, a second groove 219B is formed between the first semiconductor die 225 of the first die set and a second semiconductor die of another die set (not shown) to the left. Also, a third groove 219C is formed between the second semiconductor die 226B of the second die set and a first semiconductor die of yet another die set (not shown) to the right. In such a manner, a matrix of such grooves (e.g., comprising many rows and columns) may be formed on a wafer or panel of packages being formed. For example, each semiconductor package being formed may at this point be surrounded by a groove. Note that as discussed herein, the grooves may also extend within the interior of a semiconductor package.

In general, block 130 may comprise forming a groove in the RD wafer along dicing lines (or singulation lines) of the RD wafer. Accordingly, the scope of this disclosure should not be limited by characteristics of particular grooves or by any particular manner of forming such grooves.

The example method 100 may, at block 135, comprise molding the RD wafer (e.g., or an RD structure). Block 135 may comprise molding the RD wafer in any of a variety of manners, non-limiting examples of which are provided herein.

For example, block 135 may comprise molding over the top surface of the RD wafer, over the die and/or other components attached at block 120, over interconnection structures formed at block 110 (e.g., conductive balls, ellipsoids, columns or pillars (e.g., plated pillars, wires or wirebond wires, etc.), etc.), over the underfill formed at block 125 (if formed), in the grooves formed at block 130, etc.

Block 135 may, for example, comprise utilizing compression molding (e.g., utilizing liquid, powder and/or film) or vacuum molding. Also for example, block 135 may comprise utilizing a transfer molding process (e.g., a wafer-level transfer molding process), liquid encapsulant molding, vacuum lamination, paste printing, film assisted molding, etc.

The mold material may, for example, comprise any of a variety of characteristics. For example, the mold material (e.g., epoxy mold compound (EMC), epoxy resin molding compound, general dielectric materials, etc.) may comprise a relatively high modulus, for example to provide wafer support in a subsequent process. Also for example, the mold material may comprise a relatively low modulus, to provide wafer flexibility in a subsequent process.

As explained herein, for example with regard to block 125, the molding process of block 135 may provide underfill between the die and the RD wafer. In such an example, there may be uniformity of material between the molded underfill material and the mold material encapsulating the semiconductor die.

FIG. 2D provides an example illustration of various aspects of block 135, for example molding aspects. For example, the molded assembly 200D (which may also be referred to herein as a molded RD wafer) is shown with the mold material 230 covering the first semiconductor die 225, second semiconductor die 226, underfill 228, and the top surface of the redistribution structure 210. The mold material 230 also fills the grooves 219 (and 219B and 219C) formed at block 130. Though the mold material 230, which may also be referred to herein as encapsulant, is shown completely covering the sides and tops of the first semiconductor die 225 and second semiconductor die 226, this need not be the case. For example, block 230 may comprise utilizing a film assist or die seal molding technique to keep the die tops free of mold material. Additionally, block 130 (or any other block) may comprise thinning (e.g., grinding, etc.) the mold material 230 to provide the desired thickness and/or to expose the die.

The mold material 230 may generally, for example, directly contact and cover portions of the die 225 and 226 that are not covered by the underfill 228 (if present). For example in a scenario in which at least a first portion of the sides of the die 225 and 226 are covered by underfill 228, the mold material 230 may directly contact and cover a second portion of the sides of the die 225 and 226. The mold material 230 may also, for example, fill the space between the die 225 and 226 (e.g., at least a portion of the space that is not already filled with underfill 228).

In general, block 135 may comprise molding the RD wafer. Accordingly, the scope of this disclosure should not be limited by characteristics of any particular mold material, structure and/or technique.

The example method 100 may, at block 140, comprise attaching the molded RD wafer (e.g., the top or mold side thereof) to a wafer support structure. Block 140 may comprise attaching the molded RD wafer to the wafer support structure in any of a variety of manners, non-limiting examples of which are provided herein.

The wafer support structure may, for example, comprise a wafer or fixture formed of silicon, glass, or various other materials (e.g., dielectric materials). Block 140 may, for example, comprise attaching the molded RD wafer to the wafer support structure utilizing an adhesive, a vacuum fixture, etc. Note that in an example implementation, a redistribution structure may be formed on the top side (or backside) of the die and/or mold material prior to the wafer support attachment.

FIG. 2E provides an example illustration 200E of various aspects of block 140, for example wafer support attaching aspects. The wafer support structure 250 is attached to the top side of the mold material 230. The wafer support structure 250 may, for example, be attached with an adhesive, utilizing vacuum force, etc. Note that in an assembly in which the tops of the die 225 and 226 are exposed from the mold material 230, the wafer support structure 250 might be directly coupled to the top of the mold material 230 and to the tops of the die 225 and 226.

In general, block 140 may comprise attaching the molded RD wafer (e.g., the top or mold side thereof) to a wafer support structure. Accordingly, the scope of this disclosure should not be limited by characteristics of any particular type of wafer support structure or by characteristics of any particular manner of attaching a wafer support structure.

The example method 100 may, at block 145, comprise removing a support layer from the RD wafer. Block 145 may comprise removing the support layer in any of a variety of manners, non-limiting examples of which are provided herein.

As discussed herein, the RD wafer may comprise a support layer on which an RD structure is formed and/or carried. The support layer may, for example, comprise a semiconductor material (e.g., silicon). In an example scenario in which the support layer comprises a silicon wafer layer, block 145 may comprise removing the silicon (e.g., removing all of the silicon from the RD wafer, removing almost all of the silicon, for example at least 90% or 95% from the RD wafer, etc.). For example, block 145 may comprise mechanically grinding almost all of the silicon, followed by a dry or wet chemical etch to remove the remainder (or almost all of the remainder). In an example scenario in which the support layer is loosely attached to the RD structure formed (or carried) thereon, block 145 may comprise pulling or peeling to separate the support layer from the RD structure.

FIG. 2F provides an example illustration 200F of various aspects of block 145, for example support layer removing aspects. For example, the support layer 205 (shown in FIG. 2E) is removed from the RD structure 210. In the illustrated example, the RD structure 210 may (but need not) still comprise a base dielectric layer 211 (e.g., an oxide, nitride, etc.) as discussed herein.

As shown in FIG. 2F, in an example implementation, as a result on the removal of the support layer 205, all that remains of the RD Wafer 200A (e.g., as prepared at block 110 and as shown in FIG. 2A) is singulated (or diced) sections of the RD structure 210. For example, the RD structure 210 may comprise a top side (e.g., to which the die 225 and 226 are coupled), a bottom side (e.g., which may now be exposed after removal of the support layer 205), and a plurality of lateral sides extended between the top side and the bottom side (e.g., four of such lateral sides if the RD structure 210 is in a rectangular or square configuration).

In general, block 145 may comprise removing a support layer from the RD wafer. Accordingly, the scope of this disclosure should not be limited by characteristics of any particular type of wafer material or by characteristics of any particular manner of wafer material removal.

The example method 100 may, at block 155, comprise forming and patterning a first redistribution layer (RDL) dielectric layer for etching an oxide layer of the RD structure. Block 155 may comprise forming and patterning the first RDL dielectric layer in any of a variety of manners, non-limiting examples of which are provided herein. Note that the RDL may also be referred to herein as a redistribution structure, or signal distribution structure.

In the examples generally discussed herein, the RD structure of the RD wafer is generally formed on an oxide layer (or nitride or other dielectric). To enable metal-to-metal attachment to the RD structure, portions of the oxide layer covering traces (or pads or lands) of the RD structure may be removed, for example by etching. Note that the oxide layer need not necessarily be removed or completely removed so long as it has acceptable conductivity.

In an example implementation, the first RDL dielectric layer may comprise an organic material (e.g., polyimide (PI), benzo cyclo butane (BCB), poly benz oxazole (PBO), bismaleimide triazine (BT), a phenolic resin, epoxy, equivalents thereof, compounds thereof, etc.) formed on a first side of the base dielectric layer of the RD structure, which may comprise an oxide or nitride or other dielectric material. In various example implementations, however, the first RDL dielectric layer may comprise an inorganic material (e.g., $Si_3N_4$, $SiO_2$, SiON, etc.). The first dielectric layer may, for example, be formed utilizing a laminated film, liquid, paste, etc.

Since the support layer 205 on which the RD structure 210 was formed is removed at block 145, the first RDL dielectric layer may also be formed on portions of the mold material 230. For example, after removal of the support layer 205, the mold material 230 filling the grooves 219 (e.g., a bottom side or back side thereof) is exposed between sections of the RD structure 210. The bottom surface of the mold material 230 and the bottom (or back side) surface of the RD structure 210 may be coplanar.

The first RDL dielectric layer may, for example, be formed using any of a variety of processes (e.g., printing, spin coating, spray coating, sintering, thermal oxidation, physical vapor deposition, plasma vapor deposition, chemical vapor deposition (CVD), combination thereof, etc.), but the scope of this disclosure is not limited thereto.

The first RDL dielectric layer may, for example, be utilized as a mask for etching the base dielectric layer, for example an oxide or nitride layer (e.g., at block 160). Also for example, after etching, the first RDL dielectric layer may remain, for example to utilize in forming conductive RDL traces thereon.

In an alternative example scenario (not shown), a temporary mask layer (e.g., a temporary photoresist layer) may be utilized. For example, after etching, the temporary mask layer may be removed and replaced by a permanent RDL dielectric layer.

FIG. 2G provides an example illustration 200G of various aspects of block 155. For example, the first RDL dielectric layer 271 is formed and patterned on the base dielectric layer 211. The patterned first RDL dielectric layer 271 may, for example, comprise vias 272 through the first RDL dielectric layer 271, for example through which the base dielectric layer 211 may be etched (e.g., at block 160) and in which first traces (or portions thereof) may be formed (e.g., at block 165).

In general, block 155 may comprise forming and patterning a first dielectric layer (e.g., a first RDL dielectric layer), for example on the base dielectric layer. Accordingly, the scope of this disclosure should not be limited by characteristics of a particular dielectric layer or by characteristics of a particular manner of forming a dielectric layer.

The example method 100 may, at block 160, comprise etching the base dielectric layer (e.g., oxide layer, nitride layer, etc.), for example unmasked portions thereof, from the RD structure. Block 160 may comprise performing the etching in any of a variety of manners, non-limiting examples of which are provided herein.

For example, block 160 may comprise performing a dry etch process (or alternatively a wet etch process) to etch through portions of the base dielectric layer (e.g., oxide, nitride, etc.) exposed by vias through the first dielectric layer, which functions as a mask for the etching.

FIG. 2G provides an example illustration of various aspects of block 160, for example dielectric etching aspects. For example, portions of the base dielectric layer 211 that were shown below the first conductive traces 212 in FIG. 2F are removed from FIG. 2G. This, for example, enables a metal-to-metal contact between the first conductive traces 212 and first RDL traces formed at block 165.

In general, block 160 may, for example, comprise etching the base dielectric layer. Accordingly, the scope of this disclosure should not be limited by any particular manner of performing such etching.

The example method 100 may, at block 165, comprise forming first redistribution layer (RDL) traces. Block 165 may comprise forming the first RDL traces in any of a variety of manners, non-limiting examples of which are provided herein.

As discussed herein, the first RDL dielectric layer (e.g., formed at block 155) may be utilized for etching (e.g., at block 160) and then remain for formation of the first RDL traces. Alternatively, the first RDL dielectric layer may be formed and patterned after the etching process. In yet another alternative implementation discussed herein, the etching process for the base dielectric layer may be skipped (e.g., in an implementation in which the base dielectric layer (e.g., a thin oxide or nitride layer) is absent or conductive enough to adequately serve as a conductive path between metal traces).

Block 165 may comprise forming the first RDL traces attached to the first conductive traces of the RD structure that are exposed through the patterned first RDL dielectric layer. The first RDL traces may also be formed on the first RDL dielectric layer. Block 165 may comprise forming the first RDL traces in any of a variety of manners (e.g., electrolytic plating, electroless plating, chemical vapor deposition (CVD), sputtering or physical vapor deposition (PVD), plasma vapor deposition, printing, etc.) but the scope of this disclosure is not limited by the characteristics of any particular manner of forming such traces.

The first RDL traces may comprise any of a variety of materials (e.g., copper, gold, nickel, etc.). The first RDL traces may, for example, comprise any of a variety of dimensional characteristics. For example, a typical pitch for the first RDL traces may, for example, be 5 microns. In an example implementation, the first RDL traces may, for example, be formed at a center-to-center pitch that is approximately or at least an order of magnitude greater than a pitch at which various traces of the RD structure of the RD wafer were formed (e.g., at a sub-micron pitch, approximately 0.5 micron pitch, etc.).

FIGS. 2G and 2H provide an example illustration of various aspects of block 165, for example RDL trace forming aspects. For example, a first portion 281 of the first RDL traces may be formed in the vias 272 of the first RDL dielectric layer 271 (and of the base dielectric layer 211) and contacting the first conductive traces 212 of the RD structure 210 exposed by such vias 272. Also for example, a second portion 282 of the first RDL traces may be formed on the first RDL dielectric layer 271.

In general, block 165 may comprise forming first redistribution layer (RDL) traces. Accordingly, the scope of this disclosure should not be limited by characteristics of any particular RDL traces or by characteristics of any particular manner of forming such RDL traces.

The example method 100 may, at block 170, comprise forming and patterning a second RDL dielectric layer over the first RDL traces (e.g., formed at block 165) and the first RDL dielectric layer (e.g., formed at block 155). Block 170 may comprise forming and patterning the second dielectric layer in any of a variety of manners, non-limiting examples of which are provided herein.

For example, block 170 may share any or all characteristics with block 155. The second RDL dielectric layer may, for example, be formed utilizing a same material as the first RDL dielectric layer formed at block 155.

The second RDL dielectric layer may, for example, comprise a polyimide or a polybenzoxazole (PBO) material. The second RDL dielectric layer may, for example, generally comprise an organic material. In various example implementations, however, the first RDL dielectric layer may comprise an inorganic material.

FIG. 2H provides an example illustration 200H of various aspects of block 170. For example, the second RDL dielectric layer 283 is formed on the first RDL traces 281 and 282 and on the first RDL dielectric layer 271. As shown in FIG. 2H, vias 284 are formed in the second RDL layer 283 through which conductive contact can be made with the first RDL traces 282 exposed by such vias 284.

In general, block 170 may comprise forming and/or patterning a second RDL dielectric layer. Accordingly, the scope of this disclosure should not be limited by characteristics of any particular dielectric layer or by characteristics of any particular manner of forming a dielectric layer.

The example method 100 may, at block 175, comprise forming second redistribution layer (RDL) traces. Block 175 may comprise forming the second RDL traces in any of a variety of manners, non-limiting examples of which are provided herein. Block 175 may, for example, share any or all characteristics with block 165.

Block 175 may comprise forming the second RDL traces attached to the first RDL traces (e.g., formed at block 165)

that are exposed through vias in the patterned second RDL dielectric layer (e.g., formed at block 170). The second RDL traces may also be formed on the second RDL dielectric layer. Block 175 may comprise forming the second RDL traces in any of a variety of manners, for example by plating, but the scope of this disclosure is not limited by the characteristics of any particular manner.

As with the first RDL traces, the second RDL traces may comprise any of a variety of materials (e.g., copper, etc.). Additionally, the second RDL traces may, for example, comprise any of a variety of dimensional characteristics.

FIGS. 2H and 2I provide an example illustration of various aspects of block 175. For example, the second RDL traces 291 may be formed in vias 284 in the second RDL dielectric layer 283 to contact the first RDL traces 281 exposed through such vias 284. Additionally, the second RDL traces 291 may be formed on the second RDL dielectric layer 283.

In general, block 175 may comprise forming second redistribution layer (RDL) traces. Accordingly, the scope of this disclosure should not be limited by characteristics of any particular RDL traces or by characteristics of any particular manner of forming such RDL traces.

The signal distribution structure formed at blocks 155-180 may, for example, be a coreless signal distribution structure (e.g., without a substrate core).

The example method 100 may, at block 180, comprise forming and patterning a third RDL dielectric layer over the second RDL traces (e.g., formed at block 175) and the second RDL dielectric layer (e.g., formed at block 170). Block 180 may comprise forming and patterning the third dielectric layer in any of a variety of manners, non-limiting examples of which are provided herein.

For example, block 180 may share any or all characteristics with blocks 170 and 155. The third RDL dielectric layer may, for example, be formed utilizing a same material as the first RDL dielectric layer formed at block 155 (and/or after etching at block 160 and stripping a temporary mask layer), and/or utilizing a same material as the second RDL dielectric layer formed at block 170.

The third RDL dielectric layer may, for example, comprise a polyimide or a polybenzoxazole (PBO) material. The third RDL dielectric layer may, for example, generally comprise an organic material. In various example implementations, however, the third RDL dielectric layer may comprise an inorganic material.

FIG. 2I provides an example illustration 200I of various aspects of block 180. For example, the third RDL layer 285 may be formed on the second RDL traces 291 and on the second RDL layer 283. As shown in FIG. 2I, vias are formed in the third RDL layer 285 through which conductive contact can be made with the second RDL traces 291 exposed by such vias.

In general, block 180 may comprise forming and/or patterning a third RDL dielectric layer. Accordingly, the scope of this disclosure should not be limited by characteristics of any particular dielectric layer or by characteristics of any particular manner of forming a dielectric layer.

The example method 100 may, at block 185, comprise forming interconnection structures on the second RDL traces and/or on the third RDL dielectric layer. Block 185 may comprise forming the interconnection structures in any of a variety of manners, non-limiting examples of which are provided herein.

Block 185 may, for example, comprise forming an underbump metal on portions of the second RDL traces exposed through vias in the third dielectric layer. Block 185 may then, for example, comprise attaching conductive bumps or balls to the underbump metal. Other interconnection structures may be utilized as well, examples of which are provided herein (e.g., conductive posts or pillars, solder balls, solder bumps, etc.).

FIG. 2I provides an example illustration 200I of various aspects of block 185, for example interconnection structure forming aspects. For example, interconnection structures 292 are attached to the second RDL traces 291 through vias formed in the third RDL dielectric layer 285. Note that although the interconnection structures 292 are illustrated as being smaller than the interconnection structures 217/219, this disclosure is not so limited. For example, the interconnection structures 292 may be the same size as the interconnection structures 217/219 or larger than the interconnection structures 217/219. Additionally, the interconnection structures 292 may be the same type of interconnection structure as the interconnections structures 217/219 or may be a different type.

Though the redistribution layer(s) formed at blocks 155-185, which may also be referred to as the front side redistribution layer (RDL), are generally illustrated in FIG. 2 in a fan-out assembly (e.g., extending outside of the footprint of the die 225 and 226), they may also be formed in a fan-in assembly, for example in which the interconnection structures 292 do not generally extend outside the footprint of the die 225 and 226. Non-limiting examples of such an assembly are provided herein.

In general, block 185 may comprise forming interconnection structures, for example on the second RDL traces and/or on the third RDL dielectric layer. Accordingly, the scope of this disclosure should not be limited by characteristics of any particular interconnection structures or by any particular manner of forming interconnection structures.

The example method 100 may, at block 190, comprise debonding (or de-attaching) the wafer support that was attached at block 140. Block 190 may comprise performing such debonding in any of a variety of manners, non-limiting aspects of which are provided herein.

For example, in an example scenario in which the wafer support is adhesively attached, the adhesive may be released (e.g., using heat and/or force). Also for example, chemical release agents may be utilized. In another example scenario in which the wafer support is attached utilizing a vacuum force, the vacuum force may be released. Note that in a scenario involving adhesives or other substances to aid in the wafer support attachment, block 190 may comprise cleaning residue from the electrical assembly and/or from the wafer support after the debonding.

FIGS. 2I and 2J provide an example illustration 200I and 200J of various aspects of block 190. For example, the wafer support 250 illustrated in FIG. 2I is removed in FIG. 2J.

In general, block 190 may comprise debonding the wafer support. Accordingly, the scope of this disclosure should not be limited by characteristics of any particular type of wafer support or by any particular manner of debonding a wafer support.

The example method 100 may, at block 195, comprise dicing the wafer (or panel). Block 195 may comprise dicing the wafer (or panel) in any of a variety of manners, non-limiting examples of which are provided herein.

The discussion herein has generally focused on processing one or two packages of a wafer or panel of such packages. Such focus on one or two packages is for illustrative clarity only. It should be understood that any or all of the process steps discussed herein may be performed on an entire wafer or panel. For example, each of the illustrations provided at FIGS. 2A-2O and other figures herein may be replicated tens or hundreds of times on a single wafer or panel. For example, until dicing, there might be no separation between one of the illustrated assemblies and a neighboring assembly of the wafer or panel.

Block 195 may, for example, comprise dicing (e.g., mechanical punch-cutting, mechanical saw-cutting, laser cutting, soft beam cutting, plasma cutting, etc.) the individual packages from the wafer or panel. The result of such dicing may, for example, be the packages shown in the illustration 200K of FIG. 2K. For example, the dicing may form side surfaces of the package comprising coplanar side surfaces of a plurality of components of the package. For example, side surfaces of any or all of the mold material 230, the dielectric layers 271, 283, and 285 of the redistribution structures formed at blocks 155-180, etc., may be coplanar. For example, such layers and structures (which may also be referred to in aggregate as a redistribution structure or a signal distribution structure) may comprise a top side (e.g., facing the RD structure 210), a bottom side (e.g., at which the interconnection structures 292 are located), and a plurality of lateral sides extended between the top side and the bottom side. The lateral sides may, for example, be exposed after the dicing (or singulating).

Block 195 may, for example, be performed along some or all of the same streets along which the groove was formed at block 130. As discussed herein, during molding at block 135, the mold material flows into the groove(s) formed at block 130. In an example implementation, the dicing cuts occur through such mold material in the grooves.

FIGS. 2K and 2L provide an example illustration 200K and 200L of various aspects of block 195. The example dicing cut 295 is shown passing through the mold material 230 and the dielectric layers 271, 283, and 285 of the redistribution structures formed at blocks 155-180. The example dicing cut width WD of the cut 195 is less than the groove width WG of the groove 219. Thus, at each side of the groove 219, there is a remnant 299 of mold material having a remnant width WR. The remnant 299 is laterally adjacent to (and covers lateral sides of) the RD structure 210 that remains after the groove forming and RD wafer support layer removal performed at blocks 130 and 145.

In an example implementation, the groove width WG may be greater than the dicing cut width WD by one to two microns, or less than two microns. The remnant width WR may then, for example, be from a half to one micron. In another example implementation, the groove width WG may be greater than the dicing cut width WD by from three to five microns. The remnant width WR may then, for example, be in the 1.5 to 2.5 micron range. For example, the dicing cut width WD may be 30-40 microns, and the groove width WG may be 50 microns. In still another example implementation, the groove width WG may be greater than the dicing cut width WD by at most ten microns. The remnant width WR may then, for example, be at most five microns.

As mentioned herein, block 195 may dice (or singulate) along all of the same lines at which the grooves were formed at block 130, but this need not be the case. Example illustrations are provided at FIGS. 2M, 2N, and 2O.

FIG. 2M shows a cross-sectional view of an example implementation 200M, in which dicing (or singulating) is not performed at the center groove 219, while a dice cut 295B is performed at the left groove 219B, and a dice cut 295C is performed at the right groove 291C. Though not shown, there may be electrical interconnections between left RD structure (to which functional die 225 and 226 are coupled) and the right RD structure (to which functional die 227 and 228 are coupled). Such interconnections, if present, may for example be provided by the RDL traces formed at blocks 155 to 175.

FIG. 2N shows a cross-sectional view of an example implementation 200N, in which dicing (or singulating) is not performed at the center groove 219, while a dice cut 295B is performed at the left groove 219B, and a dice cut 295C is performed at the right groove 291C. The functional die 226 is shown spanning the center groove 219 and directly electrically connected to both the left RD structure (to which functional die 225 is coupled) and the right RD structure (to which functional die 227 is coupled). Though not shown, there may be electrical interconnections between left RD structure (to which functional die 225 and 226 are coupled) and the right RD structure (to which functional die 226 and 227 are coupled). Such interconnections, if present, may for example be provided by the RDL traces formed at blocks 155 to 175.

Note that the groove width may be consistent among all grooves (e.g., grooves that will be subject to complete dicing and grooves that will not be subject to dicing), but this is not necessary. For example, the groove width WG for grooves that will not be subject to dicing at block 195 may be narrower than the groove width WG for grooves in which dicing will be performed (or vice versa).

FIG. 2O shows a top view of an example implementation 200O, in which dicing (or singulating) is not performed at grooves 219A, 219B, 219C, and 219D, while dice cuts 295A, 295B, 295C, and 295D are performed at corresponding grooves. As shown, a functional die (e.g., die D4, die D5, die D6, and die D7) may for example be dedicated to a single RS structure (e.g., RS3, RS4, RS6, and RS7, respectively). Also for example, a functional die (e.g., die D3 and D8) may be coupled to two distinct RS structures (e.g., die D3 coupled to both RS1 and RS2, and die D8 coupled to both RS8 and RS9). A functional die may, for example, be coupled to any number of RS structures. For example, functional die D2 is coupled to each of RS2, RS3, RS5, and RS6, and functional die D1 is coupled to each of RS1, RS2, RS4, RS5, RS7, and RS8.

In general, block 195 may comprise dicing the wafer (or panel). Accordingly, the scope of this disclosure should not be limited by characteristics of any particular manner of dicing a wafer (or panel).

In the example methods and structures presented with regard to FIGS. 1 and 2A-2O, the wafer molding at block 135 is performed before the support layer removal from the RD wafer at block 145. In other example methods and structures, the wafer molding may be performed after removal of the support layer. Such example methods and structures are presented at FIGS. 3 and 4A-4J.

Figure 3:
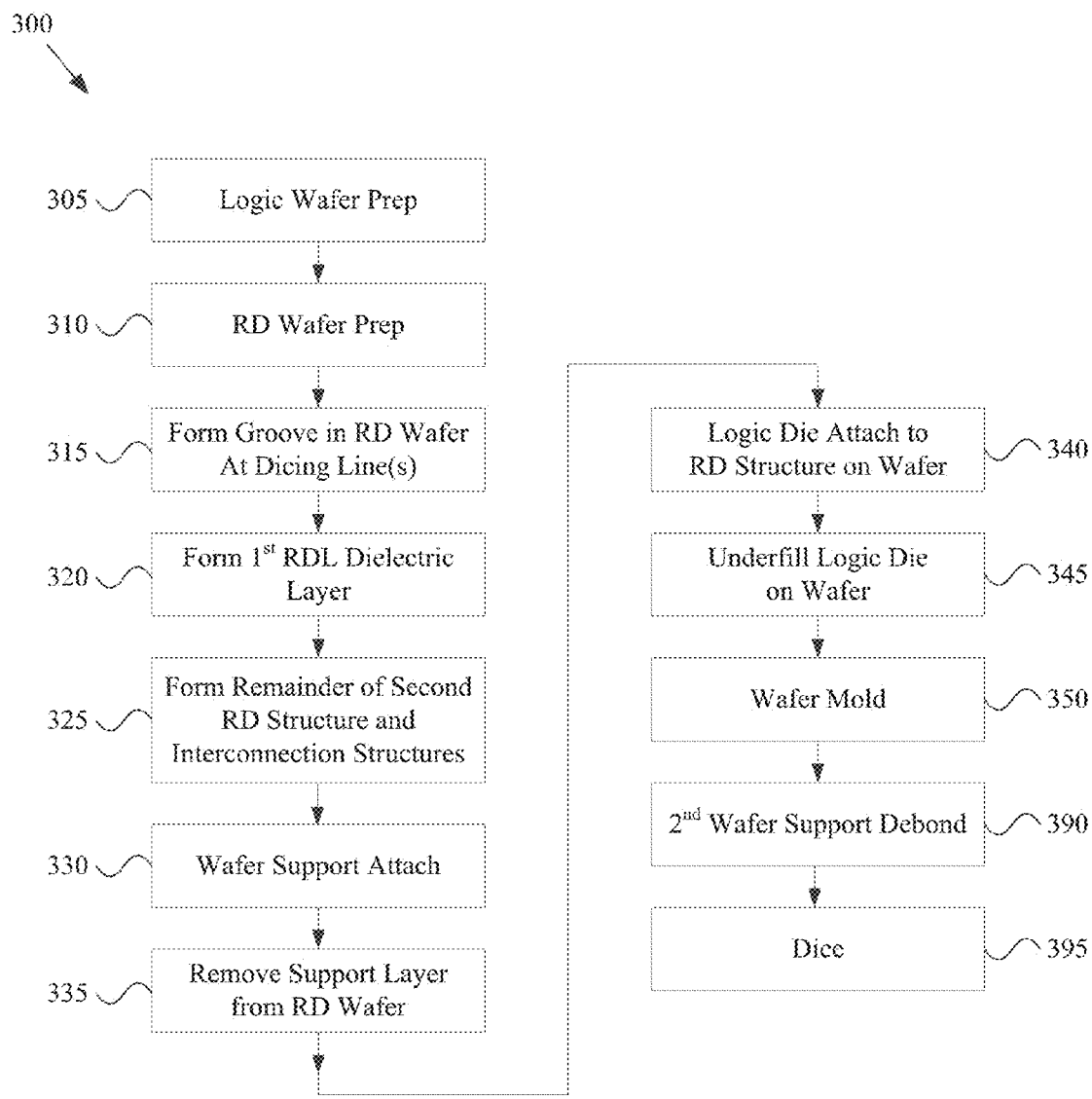
FIG. 3 shows a flow diagram of an example method of making an electronic device.

FIG. 3 shows a method 300 for manufacturing a semiconductor device, in accordance with various aspects of the present disclosure. The example method 300 may, for example, share any or all characteristics with other example methods discussed herein, for example with regard to FIGS. 1, 2A-2O, 4A-4J, 5, 6A-6H, 7, etc.

FIGS. 4A-4J are cross-sectional views illustrating various aspects of the example method 300 of FIG. 3, showing a semiconductor device being manufactured in accordance with such example method 300. The methods and structures shown in FIGS. 4A-4J may, for example, share any or all characteristics with analogous methods and structures shown in FIGS. 1, 2A-2O, 3, etc.

FIG. 3 and FIGS. 4A-4J will now be discussed together. It should be noted that the order of the example blocks of the method 300 may vary without departing from the scope of this disclosure. It should also be noted that any of the example blocks of the method 300 may be omitted and/or other blocks inserted without departing from the scope of this disclosure.

The example method 300 may, at block 305, comprise preparing a logic wafer (or a plurality thereof, for example of same or different respective types of dies) for processing (e.g., for packaging). Block 305 may share any or all characteristics with block 105 of the example method 100 of FIG. 1.

The example method 300 may, at block 310, comprise preparing a carrier, substrate, or wafer. Block 310 may share any or all characteristics with block 110 of the example method 100 of FIG. 1.

FIG. 4A provides an example illustration of various aspects of block 310. Referring to FIG. 4A, the RD wafer 400A may, for example, comprise a support layer 405 (e.g., a silicon or other semiconductor layer, a glass layer, etc.). A redistribution (RD) structure 410 may be formed on the support layer 405. The RD structure 410 may, for example, comprise a base dielectric layer 411, a first dielectric layer 413, first conductive traces 412, a second dielectric layer 416, and second conductive traces 415. As discussed herein, various interconnection structures may also be formed on the top or bottom side of the RD structure 410. The RD structure 410 may also be referred to here as a signal distribution structure.

The base dielectric layer 411 may, for example, be on the support layer 405. The base dielectric layer 411 may, for example, comprise an oxide layer, a nitride layer, etc. The base dielectric layer 411 may, for example, be formed to specification and/or may be native. The base dielectric layer 411 may be referred to as a passivation layer. The base dielectric layer 411 may be or comprise, for example, a silicon dioxide layer formed using a low pressure chemical vapor deposition (LPCVD) process.

The RD wafer 400A may also, for example, comprise first conductive traces 412 and a first dielectric layer 413. The first conductive traces 412 may, for example, comprise deposited conductive metal (e.g., copper, aluminum, tungsten, etc.). The first conductive traces 412 may be formed by sputtering, plating (e.g., electroplating or electroless plating), etc. The first conductive traces 412 may, for example, be formed at a sub-micron or sub-two-micron pitch (or center-to-center spacing). The first dielectric layer 413 may, for example, comprise an inorganic dielectric material (e.g., silicon oxide, silicon nitride, etc.). Note that in various implementations, the first dielectric layer 413 may be formed prior to the first conductive traces 412, for example formed with apertures which are then filled with the first conductive traces 412 or a portion thereof. In an example implementation, for example comprising copper conductive traces, a dual damascene process may be utilized to deposit the traces.

In an alternative implementation, the first dielectric layer 413 may comprise an organic dielectric material. For example, the first dielectric layer 413 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The organic dielectric material may be formed in any of a variety of manners, for example spin coating, spray coating, printing, sintering, thermal oxidation, physical vapor deposition (PVD), chemical vapor deposition (CVD), plasma vapor deposition, sheet lamination chemical vapor deposition (CVD), etc. In such an alternative implementation, the first conductive traces 412 may, for example, be at a 2-5 micron pitch (or center-to-center spacing).

The RD wafer 400A may also, for example, comprise second conductive traces 415 and a second dielectric layer 416. The second conductive traces 415 may, for example, comprise deposited conductive metal (e.g., copper, etc.). The second conductive traces 415 may, for example, be connected to respective first conductive traces 412 through respective conductive vias 414 (e.g., in the first dielectric layer 413). The second dielectric layer 416 may, for example, comprise an inorganic dielectric material (e.g., silicon oxide, silicon nitride, etc.). In an alternative implementation, the second dielectric layer 416 may comprise an organic dielectric material. For example, the second dielectric layer 416 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The second dielectric layer 416 may, for example, be formed using a CVD process, but the scope of this disclosure is not limited thereto.

Though two sets of dielectric layers and conductive traces are illustrated in FIG. 4A, it should be understood that the RD structure 410 of the RD wafer 400A may comprise any number of such layers and traces. For example, the RD structure 410 might comprise only one dielectric layer and/or set of conductive traces, three sets of dielectric layers and/or conductive traces, etc.

As with the logic wafer preparation at block 305, block 310 may comprise forming interconnection structures (e.g., conductive bumps, conductive balls, conductive pillars, conductive lands or pads, etc.) on a surface of the RD structure 410. Examples of such interconnection structures 217 were discussed with regard to FIG. 2A, etc. As discussed, such interconnection structures may be formed on either or both sides of the RD structure 410. Such interconnection structures 417 may, for example, be utilized to couple the RD structure 410 to various electronic components (e.g., active semiconductor components or die, passive components, etc.).

In general, block 310 may comprise preparing a redistribution structure wafer (RD wafer). Accordingly, the scope of this disclosure should not be limited by characteristics of any particular manner of performing such preparing.

The example method 300 may, at block 315 comprise forming a groove in the RD wafer along dicing lines (or singulation lines) of the RD wafer. Such groove forming may also be referred to herein as partial dicing. Block 315 may share any or all characteristics with block 130 of the example method 100 of FIG. 1.

FIG. 4B provides an example illustration of various aspects of block 315, for example groove-forming aspects. FIG. 4B shows an example grooved wafer 400B. The groove 419 is formed on a dicing line between a first attachment region 475 for a first semiconductor die or set thereof (e.g., corresponding to a first semiconductor package to be formed) and a second attachment region 476 for a second semiconductor die or set thereof (e.g., corresponding to a second semiconductor package to be formed). Additionally, a second groove 419B is formed between the first attachment region 475 and another attachment region (not shown) to the left. Also, a third groove 419C is formed between the second attachment region 476 and another attachment region (now shown) to the right. In such a manner, a matrix of such grooves (e.g., comprising many rows and columns) may be formed on a wafer or panel of packages being formed. For example, each semiconductor package being formed may at this point be surrounded by a groove. Note that as discussed herein, such grooves may also be formed that extend within the footprint of packages.

In general, block 315 may comprise forming a groove in the RD wafer along dicing lines (or singulation lines) of the RD wafer. Accordingly, the scope of this disclosure should not be limited by characteristics of a particular groove or by any particular manner of forming such groove.

The example method 300 may, at block 320, comprise forming a first redistribution layer (RDL) dielectric layer. Block 320 may, for example, share any or all characteristics with block 155 of the example method 100 of FIG. 1. Block 320 may comprise forming the first RDL dielectric layer in any of a variety of manners, non-limiting examples of which are provided herein.

In an example implementation, the first RDL dielectric layer may comprise an organic material (e.g., polyimide (PI), benzocyclobutane (BCB), polybenzoxazole (PBO), bismaleimide triazine (BT), a phenolic resin, epoxy, equivalents thereof, compounds thereof, etc.) formed on a first side of the base dielectric layer of the RD structure, which may comprise an oxide or nitride or other dielectric material. In various example implementations, however, the first RDL dielectric layer may comprise an inorganic material (e.g., $Si_3N_4$, $SiO_2$, SiON, etc.). The first RDL dielectric layer may, for example, be formed utilizing a laminated film, liquid, paste, etc.

The first RDL dielectric layer may be formed using any one or more of a variety of dielectric deposition processes, for example spin coating, spray coating, printing, sintering, thermal oxidation, physical vapor deposition (PVD), plasma vapor deposition, chemical vapor deposition (CVD), sheet lamination, a combination thereof, etc.

FIG. 4C provides an example illustration 400C of various aspects of block 320. For example, the first RDL dielectric layer 471 is formed on the RD structure 410 and also fills the grooves 419, 419B and 419C formed at block 315. The first RDL dielectric layer 471 is shown completely filling the grooves 419, 419B, and 419C (e.g., with a completely planar top surface), but complete filling is not necessary. For example, in another example implementation, there may be a dip in the top surface of the first RDL dielectric layer 471 over the grooves 419, 419B, and 419C. As shown in other illustrations, vias may be formed through the first RDL dielectric layer 471 to provide conductive access to conductive features of the RD structure 410.

In general, block 320 may comprise forming a first dielectric layer (e.g., a first RDL dielectric layer), for example on the RD structure 410 and in the grooves 419, 419B, and 419C. Accordingly, the scope of this disclosure should not be limited by characteristics of a particular dielectric layer or by characteristics of a particular manner of forming a dielectric layer.

The example method 300 may, at block 325, comprise forming the rest of a redistribution layer (or redistribution structure) on the RD structure. Block 325 may, for example, share any or all characteristics with blocks 155-185 of the example method 100 of FIG. 1. FIG. 4D provides an example illustration 400D of various aspects of block 325. Note that the interconnection structures (e.g., conductive balls or bumps, etc.) may also be formed later, for example prior to dicing.

The example method 300 may, at block 330, comprise attaching the RD wafer (or panel) with RDL structures formed thereon to a wafer support structure. Block 330 may, for example, share any or all characteristics with block 140 of the example method 100 of FIG. 1. Block 330 may comprise attaching the molded RD wafer to the wafer support structure in any of a variety of manners, non-limiting examples of which are provided herein.

The wafer support structure may, for example, comprise a wafer or fixture formed of silicon, glass, or various other materials (e.g., dielectric materials). Block 330 may, for example, comprise attaching the wafer (or panel) to the wafer support structure utilizing an adhesive, a vacuum fixture, etc.

FIG. 4E provides an example illustration 400E of various aspects of block 330, for example wafer support attaching aspects. The wafer support structure 450 is attached to the exposed side of the RDL structures formed at blocks 320-325. For example, the wafer support structure 450 may be attached to the interconnection structures and outermost dielectric layer of the RDL structures. The wafer support structure 450 may, for example, be attached with an adhesive. In an example implementation in which the interconnection structures (e.g., package interconnection structures) have already been formed, as shown in FIG. 4E, such interconnection structures may be embedded in the wafer support structure 450 and/or in an adhesive material used to attach the wafer support structure 450.

Note that relative to FIG. 4D, the drawing in FIG. 4E has been rotated 180 degrees for illustrative reasons. Also note that the drawing orientations throughout this disclosure are oriented for illustrative reasons and are not meant to imply actual assembly orientation during manufacturing, which may or may not differ from the drawings.

In general, block 330 may comprise attaching the wafer (e.g., the exposed side of the RDL) to a wafer support structure. Accordingly, the scope of this disclosure should not be limited by characteristics of any particular type of wafer support structure or by characteristics of any particular manner of attaching a wafer support structure.

The example method 300 may, at block 335, comprise removing a support layer (or a portion thereof) from the RD wafer. Block 335 may, for example, share any or all characteristics with block 145 of the example method 100 of FIG. 1. Block 335 may comprise removing the support layer in any of a variety of manners, non-limiting examples of which are provided herein.

As discussed herein, the RD wafer may comprise a support layer on which an RD structure is formed and/or carried. The support layer may, for example, comprise a semiconductor material (e.g., silicon). In an example scenario in which the support layer comprises a silicon wafer layer, block 335 may comprise removing the silicon (e.g., removing all of the silicon from the RD wafer, removing almost all of the silicon, for example at least 90% or 95% from the RD wafer, etc.). For example, block 335 may comprise mechanically grinding almost all of the silicon, followed by a dry or wet chemical etch to remove the remainder (or almost all of the remainder). In an example scenario in which the support layer is loosely attached to the RD structure formed (or carried) thereon, block 335 may comprise pulling or peeling to separate the support layer from the RD structure.

FIG. 4F provides an example illustration 400F of various aspects of block 335, for example support layer removing aspects. For example, the support layer 405 (shown in FIG. 4E) is removed from the RD structure 410. In the illustrated example, the RD structure 410 may (but need not) still comprise a base dielectric layer 411 (e.g., an oxide, nitride, etc.) as discussed herein. For example, the base dielectric layer 411 may be removed (e.g., etched, etc.) when the support layer 405 is removed. Alternatively, the base dielectric layer 411 may be removed just prior to die attachment or may have vias formed therein for die attachment to the RD structure 410. Examples of such via formation are provided herein, for example with regard to blocks 155 and 160 of the example method 100 of FIG. 1.

As shown in FIG. 4F, in an example implementation, as a result on the removal of the support layer 405, all that remains of the RD Wafer 400A (e.g., as prepared at block 410 and as shown in FIG. 4A) is singulated (or diced) sections of the RD structure 410. For example, the RD structure 410 that corresponds to the first attachment region 475 and the RD structure 410 that corresponds to the second attachment region 476 are no longer connected to each other by material from the original RD Wafer 400A (e.g., bulk silicon, etc.).

In general, block 335 may comprise removing a support layer from the RD wafer. Accordingly, the scope of this disclosure should not be limited by characteristics of any particular type of wafer material or by characteristics of any particular manner of wafer material removal.

The example method 300 may, at block 340, comprise attaching one or more semiconductor die to the RD structure (e.g., of the RD wafer). Block 340 may, for example, share any or all characteristics with block 120 of the example method 100 of FIG. 1.

Figure 4G:
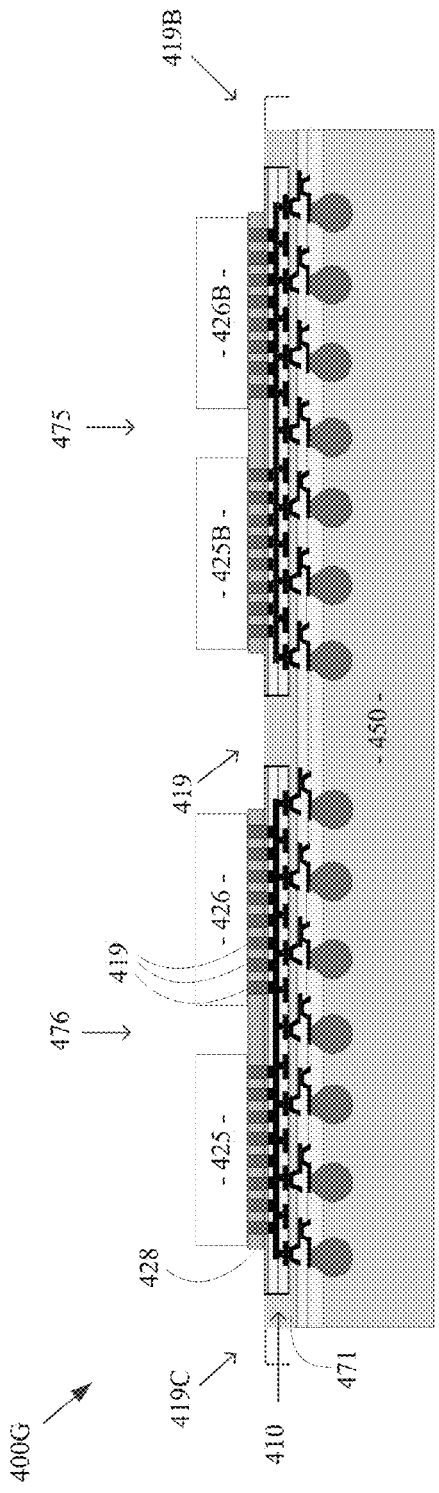

FIG. 4G provides an example illustration 400G of various aspects of block 340, for example die attachment aspects. For example, the first die 425 (e.g., which may have been diced from a logic wafer prepared at block 405) is electrically and mechanically attached to the redistribution structure 410. Similarly, the second die 426 (e.g., which may have been diced from a logic wafer prepared at block 405 or other logic wafer) is electrically and mechanically attached to the redistribution structure 410. For example, as explained at block 305 (or 105), the logic wafer (or die thereof) may have been prepared with various interconnection structures (e.g., conductive pads, lands, bumps, balls, wafer bumps, conductive pillars, copper pillars, solder-capped copper pillars, etc.) formed thereon. Such structures are shown generally in FIG. 4G as items 419.

Block 340 may, for example, comprise electrically and mechanically attaching such interconnection structures to the redistribution structure 410 utilizing any of a variety of attachment processes (e.g., mass reflow, thermocompression bonding (TCB), conductive epoxy, etc.). The first die 425 and second die 426 may, for example, share any or all characteristics of the example first die 225 and second die 226 of FIGS. 2A-2O.

The example method 300 may, at block 345, comprise underfilling the semiconductor die and/or other components attached to the RD structure at block 340. Block 345 may, for example, share any or all characteristics with block 125 of the example method 100 of FIG. 1. Block 345 may comprise performing such underfilling in any of a variety of manners, non-limiting examples of which are provided herein.

For example, after die attachment at block 340, block 345 may comprise underfilling the semiconductor die utilizing a capillary underfill. For example, the underfill may comprise a reinforced polymer material viscous enough to flow between the attached die and the RD wafer in a capillary action.

Also for example, block 345 may comprise underfilling the semiconductor die utilizing a non-conductive paste (NCP) and/or a non-conductive film (NCF) or tape while the die are being attached at block 340 (e.g., utilizing a thermocompression bonding process). For example, such underfill materials may be deposited (e.g., printed, sprayed, etc.) prior to attaching the semiconductor die (e.g., as pre-applied underfill or PUF).

As with all of the blocks illustrated in the example method 300, block 345 may be performed at any location in the method 300 flow so long as the space between the die and the redistribution structure is accessible.

The underfilling may also occur at a different block of the example method 300. For example, the underfilling may be performed as part of the wafer molding block 350 (e.g., utilizing a molded underfill). Note that the underfilling need not be performed at all.

The example method 300 may, at block 350, comprise molding the assembly (e.g., or wafer assembly). Block 350 may, for example, share any or all characteristics with block 135 of the example method 100 of FIG. 1. Block 350 may comprise molding the RD assembly in any of a variety of manners, non-limiting examples of which are provided herein.

For example, block 350 may comprise molding over the top surface of the RD structure, over the die and/or other components attached at block 340, over interconnection structures (e.g., conductive balls, ellipsoids, columns or pillars (e.g., plated pillars, wires or wirebond wires, etc.), etc.), over the underfill formed at block 345 (if formed), on the first RDL dielectric layer formed at block 320 (e.g., as formed in the grooves formed at block 315), etc.

Block 350 may, for example, comprise utilizing compression molding (e.g., utilizing liquid, powder and/or film) or vacuum molding. Also for example, block 350 may comprise utilizing a transfer molding process (e.g., a wafer-level transfer molding process), liquid encapsulant molding, vacuum lamination, paste printing, film assisted molding, etc.

The mold material may, for example, comprise any of a variety of characteristics. For example, the mold material (e.g., epoxy mold compound (EMC), epoxy resin molding compound, general dielectric materials, etc.) may comprise a relatively high modulus, for example to provide wafer support in a subsequent process. Also for example, the mold material may comprise a relatively low modulus, to provide wafer flexibility in a subsequent process.

As explained herein, for example with regard to block 345, the molding process of block 350 may provide underfill between the die and the RD structure. In such an example, there may be uniformity of material between the molded underfill material and the mold material encapsulating the semiconductor die.

Figure 4H:
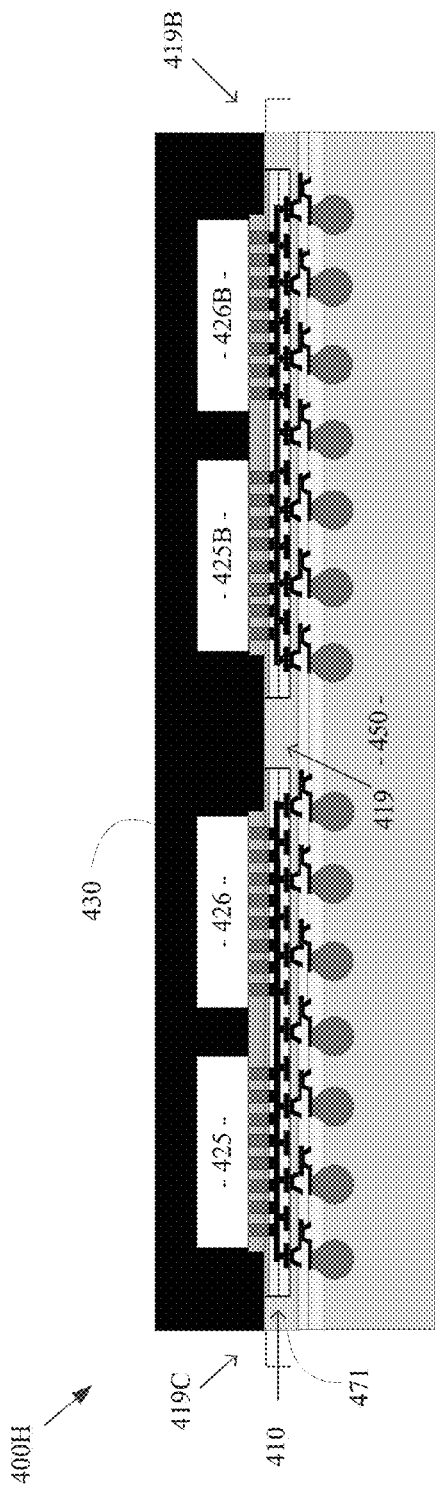

FIG. 4H provides an example illustration of various aspects of block 350, for example molding aspects. For example, the molded assembly 400H is shown with the mold material 430 covering the first semiconductor die 425, second semiconductor die 426, underfill 428, the top surface of the redistribution structure 410, and the first RDL dielectric layer 471 formed in the grooves 419, 419B, and 419C. Though the mold material 430, which may also be referred to herein as encapsulant, is shown completely covering the sides and tops of the first semiconductor die 425 and second semiconductor die 426, this need not be the case. For example, block 350 may comprise utilizing a film assist or die seal molding technique to keep the die tops free of mold material. Additionally, block 350 (or any other block) may comprise thinning (e.g., grinding, etc.) the mold material 430 to provide the desired thickness and/or to expose the die.

The mold material 430 may generally, for example, directly contact and cover portions of the die 425 and 426 that are not covered by the underfill 428. For example in a scenario in which at least a first portion of the sides of the die 425 and 426 are covered by underfill 428, the mold material 430 may directly contact and cover a second portion of the sides of the die 425 and 426. The mold material 430 may also, for example, fill the space between the die 425 and 426 (e.g., at least a portion of the space that is not already filled with underfill 428).

In general, block 350 may comprise molding the wafer (or wafer assembly). Accordingly, the scope of this disclosure should not be limited by characteristics of any particular mold material, structure and/or technique.

The example method 300 may, at block 390, comprise debonding (or de-attaching) the wafer support that was attached at block 330. Block 390 may, for example, share any or all aspects with block 190 of the example method 100 of FIG. 1. Block 390 may comprise performing such debonding in any of a variety of manners, non-limiting aspects of which are provided herein.

For example, in an example scenario in which the wafer support is adhesively attached, the adhesive may be released (e.g., using heat and/or force). Also for example, chemical release agents may be utilized. In another example scenario in which the wafer support is attached utilizing a vacuum force, the vacuum force may be released. Note that in a scenario involving adhesives or other substances to aid in the wafer support attachment, block 390 may comprise cleaning residue from the electrical assembly and/or from the wafer support after the debonding.

FIGS. 4H and 4I provide an example illustration 400H and 400I of various aspects of block 390. For example, the wafer support 450 illustrated in FIG. 4H is removed in FIG. 4I.

In general, block 390 may comprise debonding the wafer support. Accordingly, the scope of this disclosure should not be limited by characteristics of any particular type of wafer support or by any particular manner of debonding a wafer support.

The example method 300 may, at block 395, comprise dicing the wafer (or panel). Block 395 may, for example, share any or all aspects of block 195 of the example method 100 of FIG. 1. Block 395 may comprise dicing the wafer (or panel) in any of a variety of manners, non-limiting examples of which are provided herein.

The discussion herein has generally focused on processing one or two packages of a wafer or panel. Such focus on one or two packages is for illustrative clarity only. It should be understood that any or all of the process steps discussed herein may be performed on an entire wafer or panel. For example, each of the illustrations provided at FIGS. 4A-4J and other figures herein may be replicated tens or hundreds of times on a single wafer or panel. For example, until dicing, there might be no separation between one of the illustrated assemblies and a neighboring assembly of the wafer or panel.

Block 395 may, for example, comprise dicing (e.g., mechanical punch-cutting, mechanical saw-cutting, laser cutting, soft beam cutting, plasma cutting, etc.) the individual packages from the wafer or panel. The result of such dicing may, for example, be the packages shown in the example illustration 400I of FIG. 4I. For example, the dicing may form side surfaces of the package comprising coplanar side surfaces of a plurality of components of the package. For example, side surfaces of any or all of the mold material 430, the dielectric layers 471, 483, and 485 of the redistribution structures formed at blocks 320-325, etc., may be coplanar.

Block 395 may, for example, be performed along some or all of the same streets along which the groove was formed at block 315. As discussed herein, during RDL dielectric layer forming at block 320, the dielectric material is formed in (e.g., flows into, is deposited in, etc.) the groove(s) formed at block 315. In an example implementation, the dicing cuts occur through such dielectric material in (and/or over) the grooves.

FIGS. 4I and 4J provide an example illustration of various aspects of block 395. The example dicing cut 495 is shown passing through the mold material 430 and the dielectric layers 471, 483, and 485 of the redistribution structures formed at blocks 315-325. The example dicing cut width WD of the cut 495 is less than the groove width WG of the groove 419. Thus, at each side of the groove 419, there is a remnant 499 of dielectric material having a remnant width WR. The remnant 499 is laterally adjacent to (and covers) the RD structure 410 that remains after the groove forming and RD wafer support layer removal performed at blocks 315 and 335.

In an example implementation, the groove width WG may be greater than the dicing cut width WD by one to two microns, or less than two microns. The remnant width WR may then, for example, be from a half to one micron. In another example implementation, the groove width WG may be greater than the dicing cut width WD by from three to five microns. The remnant width WR may then, for example, be in the 1.5 to 2.5 micron range. For example, the dicing cut width WD may be 30-40 microns, and the groove width WG may be 50 microns. In still another example implementation, the groove width WG may be greater than the dicing cut width WD by at most ten microns. The remnant width WR may then, for example, be at most five microns.

As mentioned herein, block 395 may dice (or singulate) along all of the same lines at which the grooves were formed at block 315, but this need not be the case. Example illustrations are provided at FIGS. 2M, 2N, and 2O, and discussed herein, for example replacing the mold material 230 in the grooves 219, 219A, and 219B with the dielectric material 471 of the examples shown in FIGS. 4A-4J.

Figure 5:
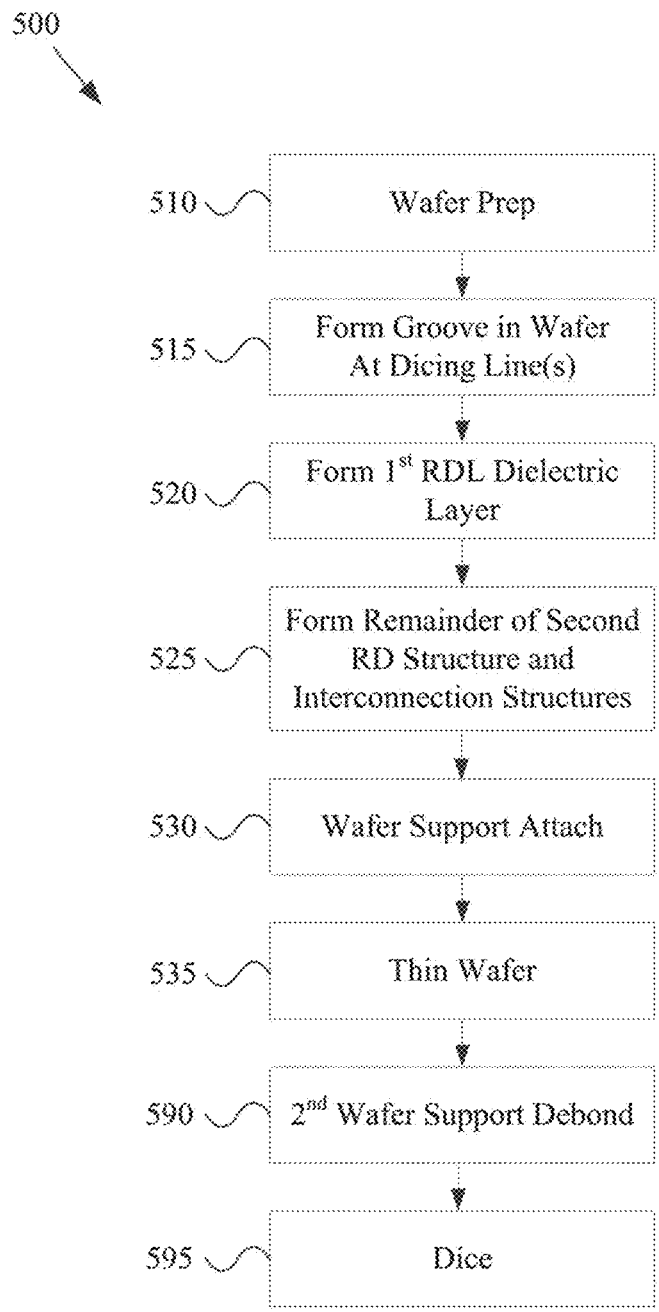
FIG. 5 shows a flow diagram of an example method of making an electronic device.

As discussed herein, the RD wafer might comprise not only the RD structure, but may also comprise semiconductor device and/or passive devices. For example, the RD wafer may comprise a wafer of functional semiconductor die. In an example scenario, additional functional semiconductor die need not be attached to the RD structure, since for example the RD structure may have been formed on and electrically coupled to functional die. Note, however, that additional die may still be added as shown in the examples of FIGS. 1-4. Additionally, the molding step may skipped. FIGS. 5-7 provide example implementations in which additional functional die are not attached to the RD structure and in which the molding step is omitted.

FIG. 5 shows a method 500 for manufacturing a semiconductor device, in accordance with various aspects of the present disclosure. The example method 500 may, for example, share any or all characteristics with other example methods discussed herein, for example with regard to FIGS. 1, 2A-2O, 3, 4A-4J, 6A-6H, 7, etc.

FIGS. 6A-6H are cross-sectional views illustrating various aspects of the example method 500 of FIG. 5, showing a semiconductor device being manufactured in accordance with such example method 500. The methods and structures shown in FIGS. 6A-6H may, for example, share any or all characteristics with analogous methods and structures shown in FIGS. 1, 2A-2O, 3, 4A-4J, 5, 7, etc.

FIG. 5 and FIGS. 6A-6H will now be discussed together. It should be noted that the order of the example blocks of the method 500 may vary without departing from the scope of this disclosure. It should also be noted that any of the example blocks of the method 500 may be omitted and/or other blocks (e.g., any other block discussed herein) may be inserted without departing from the scope of this disclosure.

The example method 500 may, at block 510, comprise preparing a wafer. Block 510 may share any or all characteristics with block 110 of the example method 100 of FIG. 1, block 310 of the example method 300 of FIG. 3, etc.

FIG. 6A provides an example illustration of various aspects of block 510. Referring to FIG. 6A, the wafer 600A may, for example, comprise a support layer 605 (e.g., a silicon or other semiconductor layer, a glass layer, etc.). The support layer 605 (or a portion thereof) may, for example, comprise bulk silicon (at least some of which, if not all, may be removed later). Active region 610 may be formed on the support layer 605, for example in die regions of the wafer 600A. The active region 610 may, for example, comprise semiconductor circuitry, integrated passive devices, signal distribution structures (e.g., comprising characteristics of any or all of the RD or RDL structures discussed herein, etc.), any of a variety of circuit elements that may be formed in back end of line (BEOL) wafer processing, etc.

A first region corresponding to a first functional die (or plurality thereof and/or other devices) to be formed into a first semiconductor device is shown generally at label 675, and a second region corresponding to a second functional die (or plurality thereof and/or other devices) to be formed into a second semiconductor device is shown generally at label 676.

Note that block 510 may comprise receiving the wafer 600A from any of a variety of sources. For example, block 510 may comprise receiving the wafer 600A from an upstream station in a manufacturing line, from a supplier at a different geographical location, etc.

In general, block 510 may comprise preparing a wafer. Accordingly, the scope of this disclosure should not be limited by characteristics of any particular manner of performing such preparing.

The example method 500 may, at block 515 comprise forming a groove in the wafer 600A along dicing lines (or singulation lines) of the wafer 600A. Such groove forming may also be referred to herein as partial dicing. Block 515 may, for example, share any or all characteristics with block 315 of the example method 300 of FIG. 3 and/or with block 130 of the example method 100 of FIG. 1.

The groove(s) may comprise any of a variety of characteristics. For example, the groove may have a depth greater than the active region of the wafer. In an example implementation in which the active region of the wafer comprises semiconductor circuitry, one or more dielectric layers and one or more conductive layers, the groove may have a depth greater than the entire thickness of such circuitry, dielectric layer(s) and conductive layer(s). For example, the groove may extend to and/or into bulk silicon of the wafer. For example, in an example implementation, the groove may have a depth that is greater than the thickness of the active region by at least one micron. In another example implementation, the groove may have a depth that is greater than the thickness of the active region by from one to five microns. In still another example implementation, the groove may have a total depth of up to ten microns or a depth that is greater than the thickness the active region by up to ten microns. The groove may, for example, have a depth that is less than 5% (or 10%) of the total thickness of the wafer.

The groove may comprise a width greater than (or, for example, no less than) a width of a dicing cut performed later, for example at block 595. For example, the groove may comprise a width that is greater than such dicing cut width by from one to two microns. Also for example, the groove may comprise a width that is greater than such dicing cut width by from three to five microns. Additionally for example, the groove may comprise a total width that is greater than such dicing cut width by no more than ten microns.

The groove may, for example, comprise a flat bottom, but may also have a bowl-shaped or beveled bottom surface. Note that although the groove is generally presented with vertical sides herein, such sides may also be sloped. For example, a groove may be wider at the top than at the bottom, or vice versa.

Block 515 may comprise forming the groove in any of a variety of manners. For example, block 515 may comprise forming the groove at a controlled depth utilizing any one or more of a mechanical saw, laser saw, plasma saw, directed energy saw, etc. In an example implementation, block 515 comprises utilizing both mechanical and laser ablation to form the groove.

FIG. 6B provides an example illustration of various aspects of block 515, for example groove-forming aspects. FIG. 6B shows an example grooved wafer 600B. The groove 619 is formed on a dicing line between the first region 675 (e.g., corresponding to a first semiconductor package to be formed) and the second region 676 (e.g., corresponding to a second semiconductor package to be formed). Additionally, a second groove 619B is formed between the first region 675 and another region (not shown) to the left. Also, a third groove 619C is formed between the second region 676 and another region (not shown) to the right. In such a manner, a matrix of such grooves (e.g., comprising many rows and columns) may be formed on a wafer or panel of packages being formed. For example, each semiconductor package being formed may at this point be surrounded by a groove. Note that as discussed herein, such grooves may also be formed that extend within the footprint of packages (e.g., between die and/or other components of a single package).

In an alternative implementation, as with all grooves formed herein, a plurality of such grooves may be formed between two adjacent regions instead of a single groove. The wafer material between such grooves may then be removed during dicing (e.g., at block 595).

In general, block 615 may comprise forming a groove in the RD wafer along dicing lines (or singulation lines) of the wafer. Accordingly, the scope of this disclosure should not be limited by characteristics of a particular groove or by any particular manner of forming such groove.

The example method 500 may, at block 520, comprise forming a first redistribution layer (RDL) dielectric layer. Block 520 may, for example, share any or all characteristics with block 320 of the example method of FIG. 3 and/or block 155 of the example method 100 of FIG. 1. Block 520 may comprise forming the first RDL dielectric layer in any of a variety of manners, non-limiting examples of which are provided herein.

In an example implementation, the first RDL dielectric layer may comprise an organic material (e.g., polyimide (PI), benzocyclobutene (BCB), polybenzoxazole (PBO), bismaleimide triazine (BT), a phenolic resin, epoxy, equivalents thereof, compounds thereof, etc.) formed on a first side of the active region. In various example implementations, however, the first RDL dielectric layer may comprise an inorganic material (e.g., $Si_3N_4$, $SiO_2$, SiON, etc.). The first RDL dielectric layer may, for example, be formed utilizing a laminated film, liquid, paste, etc.

The first RDL dielectric layer may be formed using any one or more of a variety of dielectric deposition processes, for example spin coating, spray coating, printing, sintering, thermal oxidation, physical vapor deposition (PVD), plasma vapor deposition, chemical vapor deposition (CVD), sheet lamination, a combination thereof, etc.

Figure 6C:
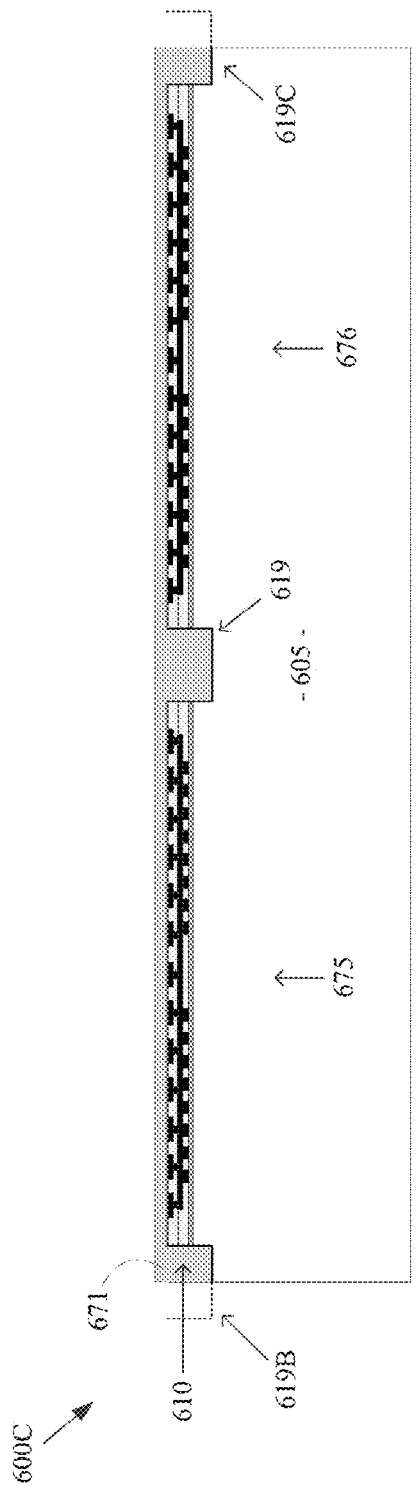
Figure 7:
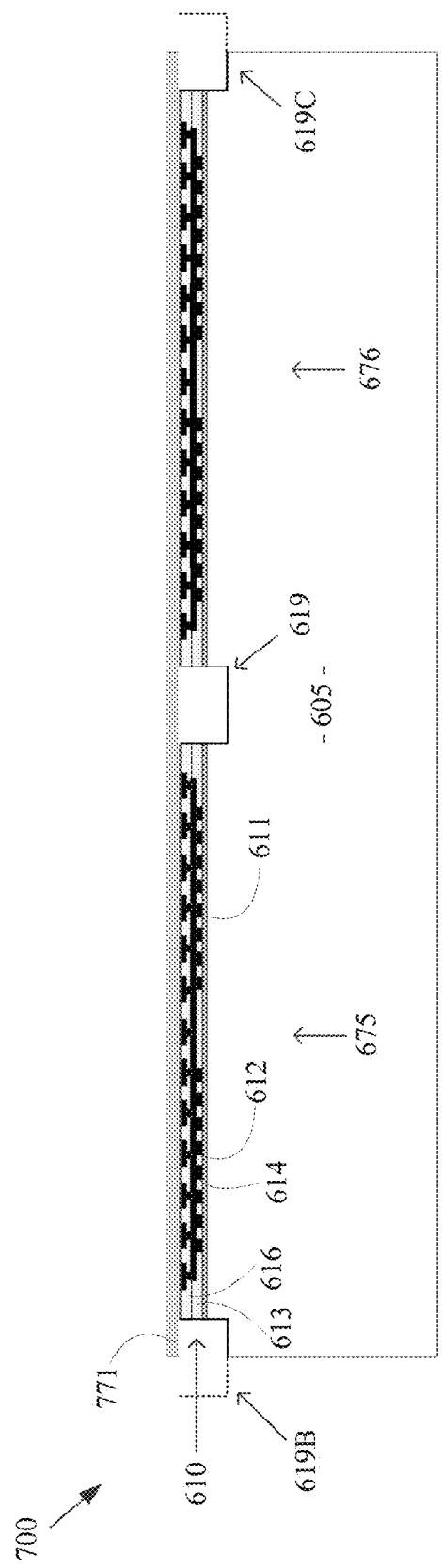
FIG. 7 shows a cross-sectional view illustrating an example electronic device and an example method of making an electronic device, in accordance with various aspects of the present disclosure.

FIG. 6C provides an example illustration 600C of various aspects of block 520. For example, the first RDL dielectric layer 671 is formed on (or over) the active region 610 and also fills the grooves 619, 619B and 619C formed at block 515. The first RDL dielectric layer 671 is shown completely filling the grooves 619, 619B, and 619C (e.g., with a completely planar top surface), but complete filling is not necessary. For example, in another example implementation, there may be a dip in the top surface of the first RDL dielectric layer 671 over the grooves 619, 619B, and 619C. In another example implementation, as will be discussed herein with regard to FIG. 7, little or none of the RDL dielectric layer 671 might extend into the grooves 619, 619B, and 619C. As shown in other illustrations, vias may be formed through the first RDL dielectric layer 671 to provide conductive access to conductive features of the active region 610. Though not shown, in an example scenario in which such conductive features of the active region 610 are covered by a dielectric layer (e.g., a native dielectric layer, a BEOL dielectric layer, etc.), such layer may be removed or vias may be formed in such layer to provide conductive access to conductive features of the active region 610.

In general, block 520 may comprise forming a first dielectric layer (e.g., a first RDL dielectric layer), for example on (or over) the active region 610 and in the grooves 619, 619B, and 619C. Accordingly, the scope of this disclosure should not be limited by characteristics of a particular dielectric layer or by characteristics of a particular manner of forming a dielectric layer.

Figure 6D:
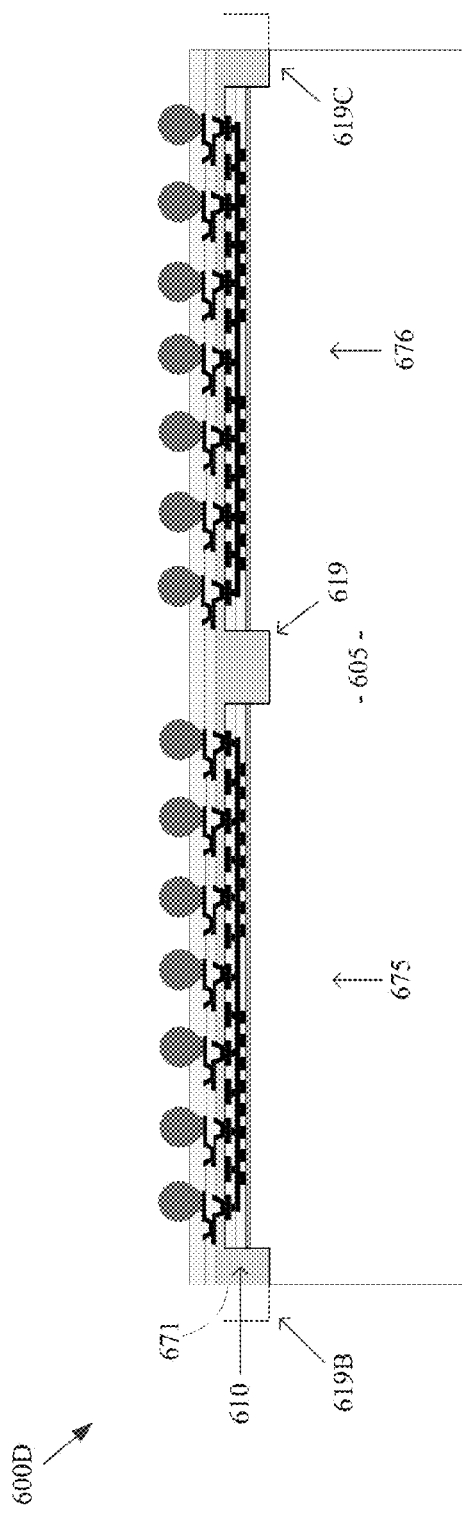

The example method 500 may, at block 525, comprise forming the rest of a redistribution layer (or redistribution structure) on the active area. Block 525 may, for example, share any or all characteristics with block 325 of the example method 300 of FIG. 3 and/or with blocks 155-185 of the example method 100 of FIG. 1. FIG. 6D provides an example illustration 600D of various aspects of block 525. Note that the interconnection structures (e.g., conductive balls or bumps, etc.) may also be formed later, for example prior to dicing at block 595.

The example method 500 may, at block 530, comprise attaching the wafer (or panel) with RDL structures formed thereon to a wafer support structure. Block 530 may, for example, share any or all characteristics with block 330 of the example method 300 of FIG. 3 and/or with block 140 of the example method 100 of FIG. 1. Block 530 may comprise attaching the wafer to the wafer support structure in any of a variety of manners, non-limiting examples of which are provided herein.

The wafer support structure may, for example, comprise a wafer or fixture formed of silicon, glass, or various other materials (e.g., dielectric materials). Block 530 may, for example, comprise attaching the wafer (or panel) to the wafer support structure utilizing an adhesive, a vacuum fixture, etc.

Figure 6E:
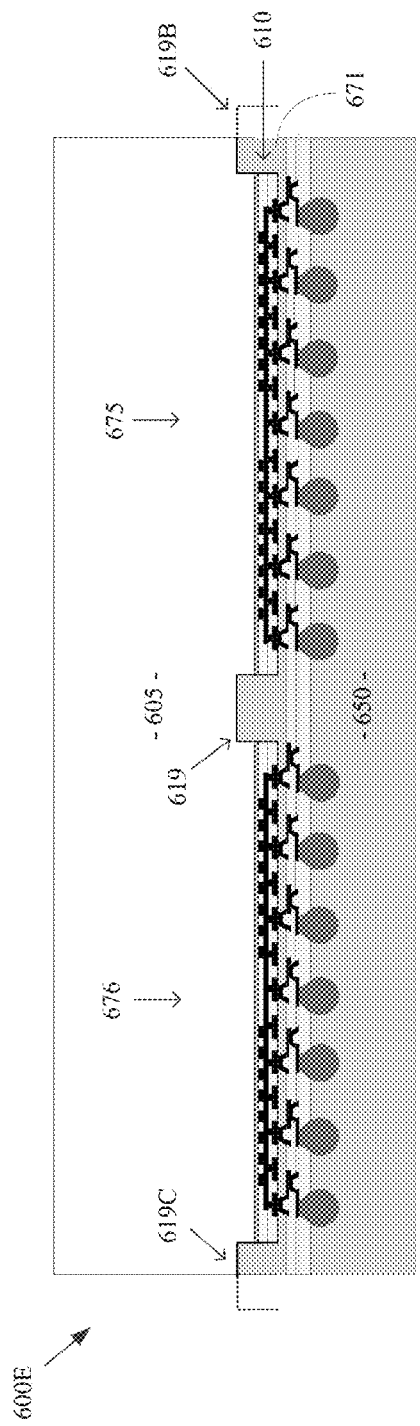

FIG. 6E provides an example illustration 600E of various aspects of block 530, for example wafer support attaching aspects. The wafer support structure 650 is attached to the exposed side of the RDL structures (which may, for example, also include interconnection structures (e.g., conductive balls or bumps, etc.)) formed at blocks 520-525. For example, the wafer support structure 650 may be attached to the interconnection structures and outermost dielectric layer of the RDL structures. The wafer support structure 650 may, for example, be attached with an adhesive. In an example implementation in which the interconnection structures (e.g., package interconnection structures) have already been formed, as shown in FIG. 6E, such interconnection structures may be embedded in the wafer support structure 650 and/or in an adhesive material used to attach the wafer support structure 650.

Note that relative to FIG. 6D, the drawing in FIG. 6E has been rotated 180 degrees for illustrative reasons. Also note that the drawing orientations throughout this disclosure are oriented for illustrative reasons and are not meant to imply actual assembly orientation during manufacturing, which may be the same as drawings, but which may also be different without departing from the scope of this disclosure.

In general, block 530 may comprise attaching the wafer (e.g., the exposed side of the RDL) to a wafer support structure. Accordingly, the scope of this disclosure should not be limited by characteristics of any particular type of wafer support structure or by characteristics of any particular manner of attaching a wafer support structure.

The example method 500 may, at block 535, comprise thinning the wafer. Block 535 may, for example, share any or all characteristics with block 335 of the example method 300 of FIG. 3 and/or block 145 of the example method 100 of FIG. 1. Block 335 may comprise thinning the wafer in any of a variety of manners, non-limiting examples of which are provided herein.

As discussed herein, the wafer may comprise a support layer on which active semiconductor circuitry, integrated passive devices, and/or RD structures are formed and/or carried. The support layer may, for example, comprise a semiconductor material (e.g., bulk silicon). In an example scenario in which the support layer comprises a bulk silicon layer, block 535 may comprise removing the bulk silicon (e.g., removing all of the bulk silicon from the wafer, removing almost all of the bulk silicon, for example at least 80% or 90% from the wafer, etc.). For example, block 535 may comprise mechanically grinding the bulk silicon. Note that the support layer may be removed to any desired amount, for example to achieve a desired device thinness while maintaining at least a minimum desired amount of structural integrity.

Figure 6F:
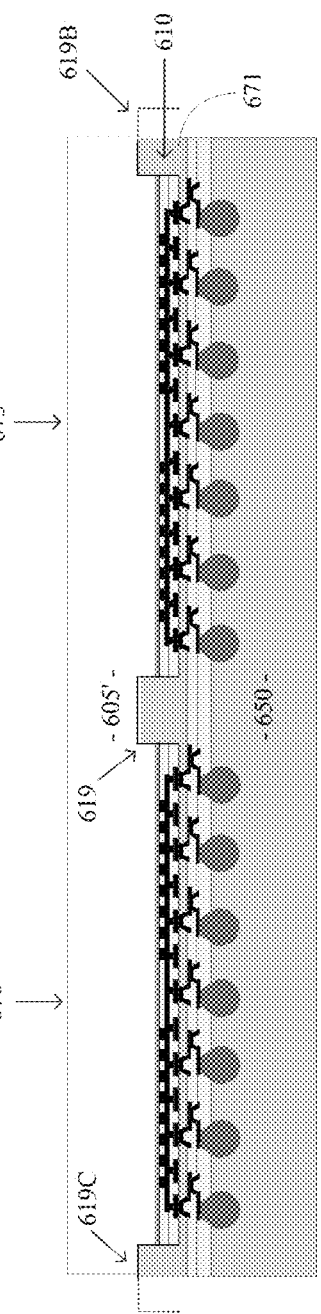

FIG. 6F provides an example illustration 600F of various aspects of block 535, for example wafer thinning aspects. For example, the support layer 605 (shown in FIG. 6E), or a portion thereof, is removed from the wafer support layer 605, resulting in a remaining portion 605'. In the illustrated example, the active area 610 may still be attached to at least a portion of the wafer support layer 605' (e.g., bulk silicon).

As shown in FIG. 6F, in an example implementation, as a result on the removal of a substantial portion of the support layer 605, all that remains of the original wafer 600A (e.g., as prepared at block 610 and as shown in FIG. 6A) are regions of the wafer 600A to be formed into semiconductor device packages. For example, excess material of the support layer 605 (e.g., excess bulk silicon) is removed.

In general, block 535 may comprise thinning the wafer. Accordingly, the scope of this disclosure should not be limited by characteristics of any particular type of wafer material or by characteristics of any particular manner of wafer material removal.

The example method 500 may, at block 590, comprise debonding (or de-attaching) the wafer support that was attached at block 530. Block 590 may, for example, share any or all aspects of block 390 of the example method 300 of FIG. 3 and/or block 190 of the example method 100 of FIG. 1. Block 590 may comprise performing such debonding in any of a variety of manners, non-limiting aspects of which are provided herein.

For example, in an example scenario in which the wafer support is adhesively attached, the adhesive may be released (e.g., using heat and/or force). Also for example, chemical release agents may be utilized. In another example scenario in which the wafer support is attached utilizing a vacuum force, the vacuum force may be released. Note that in a scenario involving adhesives or other substances to aid in the wafer support attachment, block 590 may comprise cleaning residue from the electrical assembly and/or from the wafer support after the debonding.

Figure 6G:
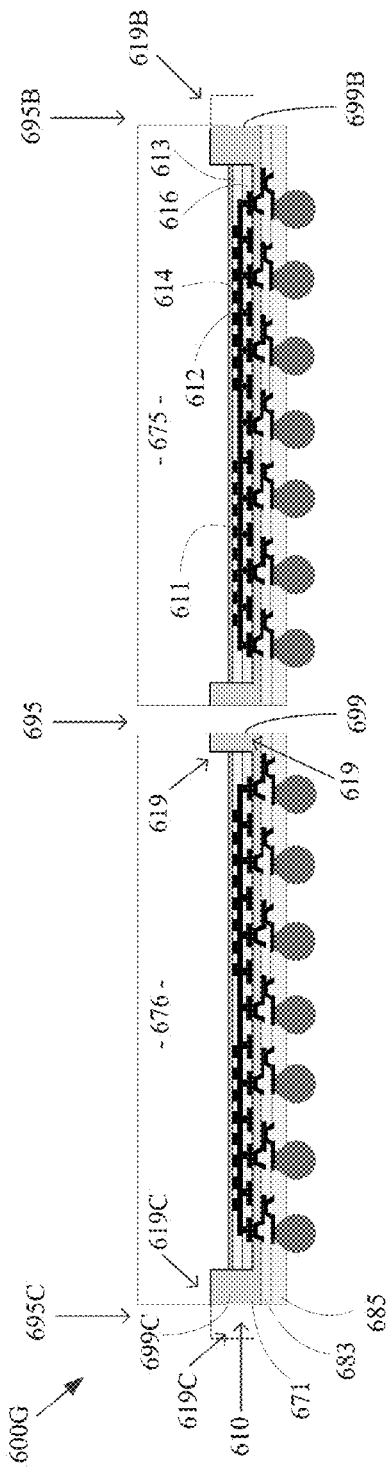

FIGS. 6F and 6G provide an example illustration 600F and 600G of various aspects of block 590. For example, the wafer support 650 illustrated in FIG. 6F is removed in FIG. 6G.

In general, block 590 may comprise debonding the wafer support. Accordingly, the scope of this disclosure should not be limited by characteristics of any particular type of wafer support or by any particular manner of debonding a wafer support.

The example method 500 may, at block 595, comprise dicing the wafer (or panel). Block 595 may, for example, share any or all aspects with block 395 of the example method 300 of FIG. 3 and/or with block 195 of the example method 100 of FIG. 1. Block 595 may comprise dicing the wafer (or panel) in any of a variety of manners, non-limiting examples of which are provided herein.

The discussion herein has generally focused on processing one or two packages of a wafer or panel. Such focus on one or two packages is for illustrative clarity only. It should be understood that any or all of the process steps discussed herein may be performed on an entire wafer or panel. For example, each of the illustrations provided at FIGS. 6A-6H and other figures herein may be replicated tens or hundreds of times on a single wafer or panel. For example, until dicing, there might be no separation between one of the illustrated assemblies and a neighboring assembly of the wafer or panel.

Block 595 may, for example, comprise dicing (e.g., mechanical punch-cutting, mechanical saw-cutting, laser cutting, soft beam cutting, plasma cutting, etc.) the individual packages from the wafer or panel. The result of such dicing may, for example, be the packages shown in the illustration 600G of FIG. 6G. For example, the dicing may form side surfaces of the package comprising coplanar side surfaces of a plurality of components of the package. For example, side surfaces of any or all of the bulk silicon remaining after the block 535 thinning, the dielectric layer formed at block 520, dielectric layers formed at block 525, etc., may be coplanar.

Block 595 may, for example, be performed along some or all of the same streets along which the groove was formed at block 515. As discussed herein, during RDL dielectric layer forming at block 520, the dielectric material is formed in (e.g., flows into, is deposited in, etc.) the groove(s) formed at block 515. In an example implementation, the dicing cuts occur through such dielectric material in (and/or over) the grooves.

Figure 6H:
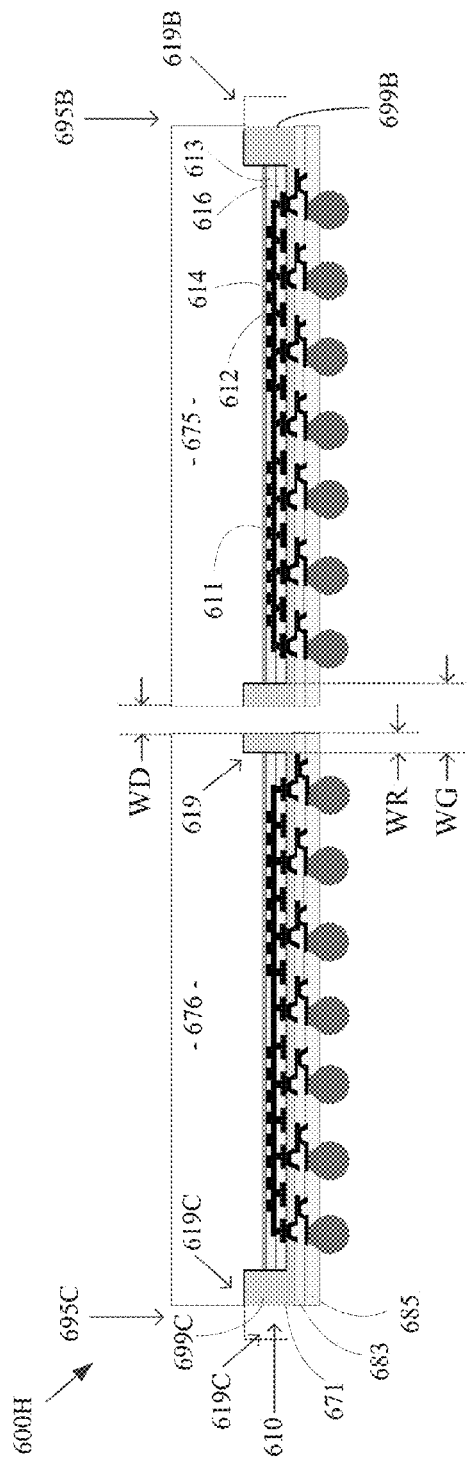

FIGS. 6G and 6H provide an example illustration 600G and 600H of various aspects of block 595. The example dicing cut 695 is shown passing through any or all of the bulk silicon 605', the dielectric layer 671, and the dielectric layer(s) formed at block 520. The example dicing cut width WD of the cut 695 is less than the groove width WG of the groove 619. Thus, at each side of the groove 619, there is a remnant 699 of dielectric material having a remnant width WR. The remnant 699 is laterally adjacent to (and covers) the active region 610 that remains after the groove forming and wafer thinning performed at blocks 515 and 535.

In an example implementation, the groove width WG may be greater than the dicing cut width WD by one to two microns, or less than two microns. The remnant width WR may then, for example, be from a half to one micron. In another example implementation, the groove width WG may be greater than the dicing cut width WD by from three to five microns. The remnant width WR may then, for example, be in the 1.5 to 2.5 micron range. For example, the dicing cut width WD may be 30-40 microns, and the groove width WG may be 50 microns. In another example implementation, the groove width WG may be in the 20-100 micron range. In still another example implementation, the groove width WG may be greater than the dicing cut width WD by at most ten microns. The remnant width WR may then, for example, be at most five microns.

As mentioned herein, block 595 may dice (or singulate) along all of the same lines at which the grooves were formed at block 315, but this need not be the case.

As shown in FIGS. 5 and 6A-6H, various example methods and structures herein may result in a wafer level chip scale package with enhanced reliability.

As discussed herein, in various example implementations the grooves 619, 619B, and 619C may be left substantially or completely empty. For example, the first RDL layer may be formed in a manner that spans the groove without entering the groove and/or is only selectively formed over the regions corresponding to semiconductor packages being formed.

For example, at block 520, the first RDL layer may be formed by laminating a dielectric sheet on the wafer, where the dielectric sheet spans the grooves. An example of this is shown at FIG. 7 with the first RDL layer 771 spanning the grooves 619, 619B, and 619C. The rest of the processing of the example method 500 may, for example, remain the same. For example, side surfaces of any or all of the bulk silicon 605' remaining after the block 535 thinning, the first RDL dielectric layer 771 formed at block 520, dielectric layers formed at block 525, etc., may be coplanar after the dicing at block 595. In this example implementation, the lateral side surfaces of the active area may be exposed rather than covered by a remnant of the first RDL dielectric layer 671 as shown in FIG. 6G, and may be recessed relative to the other side surfaces formed by the dicing at block 595. Alternatively, at least a top portion of the lateral side surfaces of the active area may be covered by a remnant of the first RDL dielectric layer 671.

The processing and/or structural examples provided herein may, for example, share any or all characteristics with those disclosed in U.S. patent application Ser. No. 14/823,689, filed Aug. 11, 2015, and titled "Semiconductor Package and Fabricating Method Thereof"; and with those disclosed in U.S. Provisional Patent Application No. 62/287,544, filed Jan. 27, 2016, and titled "Semiconductor Package and Fabricating Method Thereof"; the entire contents of each of which are hereby incorporated herein by reference. For example and without limitation, any or all of the package structures shown in such applications may be formed utilizing the methods and structures disclosed herein.

The discussion herein included numerous illustrative figures that showed various portions of a semiconductor package assembly. For illustrative clarity, such figures did not show all aspects of each example assembly. Any of the example assemblies provided herein may share any or all characteristics with any or all other assemblies provided herein. For example and without limitation, any of the example assemblies shown and discussed with regard to FIGS. 1-2, or portions thereof, may be incorporated into any of the example assemblies discussed with regard to FIGS. 3-4. Conversely, any of the assemblies shown and discussed with regard to FIGS. 3-4 may be incorporated into the assemblies shown and discussed with regard to FIGS. 1-2.

In summary, various aspects of this disclosure provide a semiconductor package structure and a method for making a semiconductor package. As non-limiting examples, various aspects of this disclosure provide various semiconductor package structures, and methods for making thereof, that comprise a bridge die that routes electrical signals between a plurality of other semiconductor die. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
    a first signal distribution structure (DS1) comprising a first DS1 dielectric layer, a first DS1 conductor layer, a DS1 top side, a DS1 bottom side, and a plurality of DS1 lateral sides that extend between the DS1 top side and the DS1 bottom side;
    a second signal distribution structure (DS2) comprising a first DS2 dielectric layer, a first DS2 conductor layer, a DS2 top side, a DS2 bottom side, and a plurality of DS2 lateral sides that extend between the DS2 top side and the DS2 bottom side, wherein the DS1 bottom side is coupled to the DS2 top side, and the DS2 top side comprises a central portion covered by the DS1 bottom side and a peripheral portion around the DS1 bottom side that is not covered by the DS1 bottom side;
    a first functional semiconductor die coupled to the DS1 top side; and
    a dielectric material (DM) covering at least the DS1 lateral sides and the peripheral portion of the DS2 top side, the dielectric material comprising a DM top side, a DM bottom side, and DM lateral sides that extend between the DM top side and the DM bottom side, wherein the DM bottom side is coplanar with the DS1 bottom side.

2. The electronic device of claim 1, wherein:
    all of the DS2 lateral sides are exposed; and
    the dielectric material covers all lateral sides of the first functional semiconductor die, and a top side of the first functional semiconductor die.

3. The electronic device of claim 1, wherein the dielectric material covering at least one of the DS1 lateral sides is no more than five microns thick.

4. The electronic device of claim 1, wherein the first signal distribution structure, but not the second signal distribution structure, is formed from a die singulated from a semiconductor wafer.

5. The electronic device of claim 1, wherein the first DS1 dielectric layer comprises an inorganic dielectric material, and the first DS2 dielectric layer comprises an organic dielectric material.

6. The electronic device of claim 1, wherein both the first signal distribution structure and the second signal distribution structure are coreless.

7. The electronic device of claim 1, wherein the dielectric material is a single layer of a mold compound.

8. The electronic device of claim 7, wherein the single layer of the mold compound covers lateral sides of the first functional semiconductor die.

9. The electronic device of claim 1, wherein the DM top side has a first vertical height from the DS2 top side, the DS1 top side has a second vertical height from the DS2 top side, and the second vertical height is different from the first vertical height.

10. The electronic device of claim 1, wherein the dielectric material comprises a single layer of dielectric material that covers at least the DS1 lateral sides, the peripheral portion of the DS2 top side, lateral sides of the first functional semiconductor die, and a peripheral portion of the DS1 top side that is not covered by the first functional die.

11. An electronic device comprising:
    a first signal distribution structure (DS1) comprising a first DS1 dielectric layer and a first DS1 conductor layer, the first signal distribution structure comprising a DS1 top side, a DS1 bottom side, and a plurality of DS1 lateral sides that extend between the DS1 top side and the DS1 bottom side;
    a second signal distribution structure (DS2) comprising a first DS2 dielectric layer and a first DS2 conductor layer, the second signal distribution structure comprising a DS2 top side, a DS2 bottom side, and a plurality of DS2 lateral sides that extend between the DS2 top side and the DS2 bottom side, wherein the DS1 bottom side is coupled to the DS2 top side, and the DS2 top side comprises a first central portion covered by the DS1 bottom side and a first peripheral portion around the DS1 bottom side that is not covered by the DS1 bottom side;
    a third signal distribution structure (DS3) comprising a first DS3 dielectric layer and a first DS3 conductor layer, the third signal distribution structure comprising a DS3 top side, a DS3 bottom side, and a plurality of DS3 lateral sides that extend between the DS3 top side and the DS3 bottom side, wherein the DS3 bottom side is coupled to the DS2 top side, and the DS2 top side comprises a second central portion covered by the DS3 bottom side and a second peripheral portion around the DS3 bottom side that is not covered by the DS3 bottom side;
    a first functional semiconductor die coupled to the DS1 top side; and
    a dielectric material covering at least the DS1 lateral sides, the DS3 lateral sides, the first peripheral portion of the DS2 top side, and the second peripheral portion of the DS2 top side.

12. The electronic device of claim 11, wherein the dielectric material covering at least one of the DS1 lateral sides and at least one of the DS3 lateral sides is no more than five microns thick.

13. The electronic device of claim 11, wherein all space directly between the first signal distribution structure and the third signal distribution structure is filled with the dielectric material.

14. The electronic device of claim 11, wherein all of the DS2 lateral sides are exposed.

15. The electronic device of claim 11, wherein the second signal distribution structure electrically couples the first signal distribution structure and the third signal distribution structure to each other.

16. The electronic device of claim 11, wherein the DS3 bottom side is directly coupled to the DS2 top side.

17. The electronic device of claim 16, wherein:
the second central portion of the DS2 top side is different from the first central portion of the DS2 top side; and
the second peripheral portion of the DS2 top side is different from the first peripheral portion of the DS2 top side.

18. An electronic device comprising:
a first signal distribution structure (DS1) comprising a first DS1 dielectric layer and a first DS1 conductor layer, the first signal distribution structure comprising a DS1 top side, a DS1 bottom side, and a plurality of DS1 lateral sides that extend between the DS1 top side and the DS1 bottom side;
a second signal distribution structure (DS2) comprising a first DS2 dielectric layer and a first DS2 conductor layer, the second signal distribution structure comprising a DS2 top side, a DS2 bottom side, and a plurality of DS2 lateral sides that extend between the DS2 top side and the DS2 bottom side, wherein the DS1 bottom side is coupled to the DS2 top side, and the DS2 top side comprises a first central portion covered by the DS1 bottom side and a first peripheral portion around the DS1 bottom side that is not covered by the DS1 bottom side;
a third signal distribution structure (DS3) comprising a first DS3 dielectric layer and a first DS3 conductor layer, the third signal distribution structure comprising a DS3 top side, a DS3 bottom side, and a plurality of DS3 lateral sides extended between the DS3 top side and the DS3 bottom side, wherein the DS3 bottom side is coupled to the DS2 top side, and the DS2 top side comprises a second central portion covered by the DS3 bottom side and a second peripheral portion around the DS3 bottom side that is not covered by the DS3 bottom side;
a first functional semiconductor die coupled to the DS1 top side and to the DS3 top side; and
a dielectric material covering at least the DS1 lateral sides, the DS3 lateral sides, the first peripheral portion of the DS2 top side, and the second peripheral portion of the DS2 top side.

19. The electronic device of claim 18, comprising a second functional semiconductor die that is coupled to only the first signal distribution structure.

20. The electronic device of claim 18, wherein all of the DS2 lateral sides are exposed.

21. The electronic device of claim 18, wherein the second signal distribution structure electrically couples the first signal distribution structure and the third signal distribution structure to each other.

22. The electronic device of claim 18, comprising a fourth signal distribution structure (DS4), wherein:
the fourth signal distribution structure comprises a first DS4 dielectric layer and a first DS4 conductor layer;
the fourth signal distribution structure comprises a DS4 top side, a DS4 bottom side, and a plurality of DS4 lateral sides that extend between the DS4 top side and the DS4 bottom side;
the DS4 bottom side is coupled to the DS2 top side;
the DS2 top side comprises a third central portion covered by the DS4 bottom side and a third peripheral portion around the DS4 bottom side that is not covered by the DS4 bottom side; and
the first functional semiconductor die is coupled to the DS4 top side.

* * * * *